(12) United States Patent
Sharma et al.

(10) Patent No.: US 11,816,343 B2
(45) Date of Patent: Nov. 14, 2023

(54) DATA STORAGE DEVICE ENABLING LATCHES OF NON-VOLATILE MEMORY DIES FOR USE AS EXTERNALLY-ACCESSIBLE VOLATILE MEMORY

(71) Applicant: Western Digital Technologies, Inc., San Jose, CA (US)

(72) Inventors: Amit Sharma, Bengaluru (IN); Dinesh Kumar Agarwal, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 22 days.

(21) Appl. No.: 17/184,387

(22) Filed: Feb. 24, 2021

(65) Prior Publication Data

US 2022/0171558 A1 Jun. 2, 2022

Related U.S. Application Data

(60) Provisional application No. 63/119,418, filed on Nov. 30, 2020.

(51) Int. Cl.
*G06F 3/06* (2006.01)
*G11C 16/04* (2006.01)

(52) U.S. Cl.
CPC .......... *G06F 3/0644* (2013.01); *G06F 3/0604* (2013.01); *G06F 3/0659* (2013.01); *G06F 3/0679* (2013.01); *G11C 16/0483* (2013.01)

(58) Field of Classification Search
CPC .... G06F 3/0644; G06F 3/0604; G06F 3/0659; G06F 3/0679; G11C 16/0483
USPC .......................................................... 711/103
See application file for complete search history.

(56) References Cited

U.S. PATENT DOCUMENTS

| | | | |
|---|---|---|---|
| 7,882,299 B2 | 2/2011 | Conley et al. | |
| 8,705,286 B2 | 4/2014 | Li | |
| 8,738,840 B2 | 5/2014 | Tzeng | |
| 10,430,328 B2 | 10/2019 | Sela et al. | |
| 10,564,872 B2 | 2/2020 | Benisty | |
| 2004/0215435 A1* | 10/2004 | Hunt | G06F 30/30 703/15 |
| 2006/0074970 A1* | 4/2006 | Narayanan | G06F 11/3476 707/999.102 |
| 2006/0221704 A1* | 10/2006 | Li | G06F 12/0893 365/185.28 |

(Continued)

*Primary Examiner* — Gautam Sain
(74) *Attorney, Agent, or Firm* — LOZA & LOZA, LLP; Gabriel Fitch

(57) ABSTRACT

Non-volatile memory (NVM) dies of a data storage device, wherein on-chip latches of the dies are made available to a host device for use as volatile memory. In some examples, a data storage controller dynamically determines when the latches of a particular NVM die of an NVM array are available for use as volatile memory and exports those particular latches to the host device for use as random access memory (RAM). In other examples, the data storage controller dynamically determines when particular dies of the NVM array of dies are available and exports all latches of those dies to the host device for use as RAM. The data storage controller may rotate NVM die usage so that, over time, different dies are used for latch-based volatile memory while other dies are used for NVM storage. Usage profiles are described that allow the host device to select particular latch usage configurations.

34 Claims, 14 Drawing Sheets

(56) References Cited

U.S. PATENT DOCUMENTS

| | | | |
|---|---|---|---|
| 2008/0170436 A1* | 7/2008 | Chun | G11C 16/22 |
| | | | 365/185.11 |
| 2014/0063948 A1* | 3/2014 | Lim | G11C 16/06 |
| | | | 365/185.11 |
| 2017/0123991 A1 | 5/2017 | Sela et al. | |
| 2018/0150400 A1* | 5/2018 | Agarwal | G11C 11/5628 |
| 2018/0173444 A1* | 6/2018 | Marcu | G06F 3/0658 |
| 2019/0114103 A1* | 4/2019 | Shlick | G11C 16/10 |
| 2019/0340125 A1* | 11/2019 | Mondello | G06F 11/1068 |
| 2020/0004445 A1* | 1/2020 | Benisty | G06F 3/0664 |

* cited by examiner

DATA STORAGE DEVICE ENABLING LATCHES OF NON-VOLATILE MEMORY DIES FOR USE AS EXTERNALLY-ACCESSIBLE VOLATILE MEMORY

CROSS-REFERENCE TO RELATED APPLICATIONS

This application claims priority to and the benefit of U.S. Provisional Patent Application No. 63/119,418, filed on Nov. 30, 2020 entitled, "DATA STORAGE DEVICE ENABLING LATCHES OF NON-VOLATILE MEMORY DIES FOR USE AS EXTERNALLY-ACCESSIBLE VOLATILE MEMORY," the entire content of which is incorporated herein by reference.

FIELD

The disclosure relates, in some aspects, to data storage devices with non-volatile memory (NVM). More specifically, but not exclusively, aspects relate to systems and methods for dynamically managing storage within NVM data storage devices of Edge computing nodes.

INTRODUCTION

Edge computing generally refers to distributed computing topologies that locate computation and data storage closer to where it is needed so as to improve response times and save bandwidth (rather than relying on a centralized servers or the like). Edge computing may employ computing devices that compute data at an Edge computing node that is remote from a server. Such computations may consume considerable random access memory (RAM) resources within the node. The computation resources within Edge computing nodes may be highly constrained by cost with RAM chips adding significantly to the cost of each Edge node. There is thus an unmet need to provide Edge computing devices that reduce the amount of RAM while still providing adequate volatile memory to meet the needs of Edge computing.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a data storage device that includes: a memory die with non-volatile memory (NVM) storage elements and a latch; and a controller coupled to the memory die and configured to: notify a processing device external to the memory die that the latch is available for use as volatile memory by the processing device; store data in the latch in response to a volatile memory write command received from the processing device; and retrieve the data from the latch in response to a volatile memory read command received from the processing device.

Another embodiment of the disclosure provides a method for use by a controller of a data storage device that includes a memory die with NVM storage elements and a latch. The method includes: notifying a processing device external to the memory die that the latch is available for use as volatile memory by the processing device; storing data in the latch in response to a volatile memory write command received from the processing device; and retrieving the data from the latch in response to a volatile memory read command received from the processing device.

Another embodiment of the disclosure provides a data storage apparatus that includes a controller and a memory die having NVM storage elements and a latch. The apparatus includes: means for notifying a processing device external to the memory die that the latch is available for use as volatile memory by the processing device; means for storing data in the latch in response to a volatile memory write command received from the processing device; and means for retrieving the data from the latch in response to a volatile memory read command received from the processing device.

DETAILED DESCRIPTION

Figure 1:
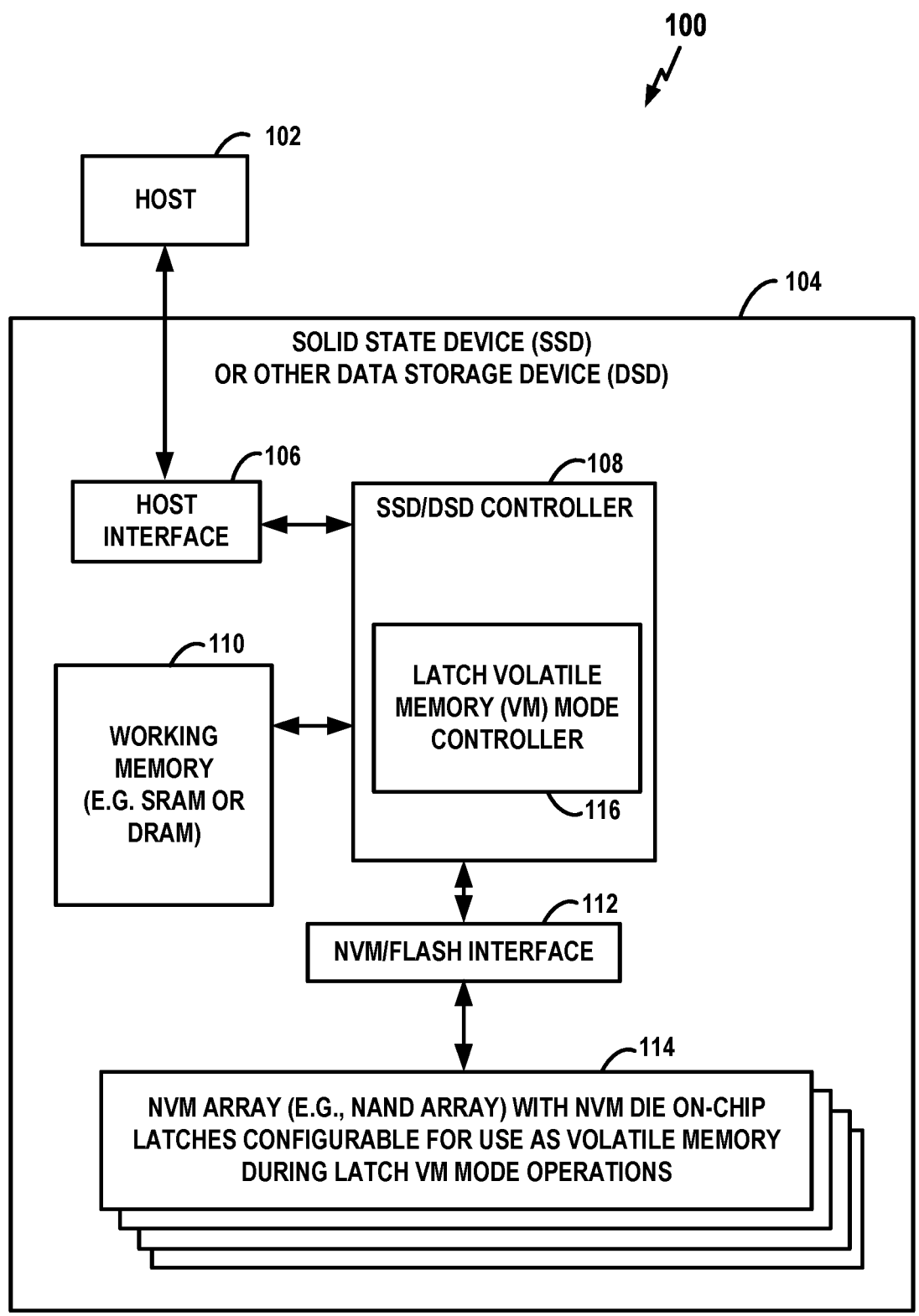
FIG. 1 is a schematic block diagram of a data storage device in the form of an exemplary solid state device (SSD), or other data storage device (DSD), having a non-volatile memory (NVM) array, wherein latches within the NVM array may be used as volatile memory (VM) by the host or DSD.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM) arrays, and to data storage devices or apparatus for controlling the NVM arrays, such as a controller of a data storage device (DSD), such as a solid state device (SSD), and in particular to solid-state memory storage devices such as those that use NAND flash memory (herein "NANDs"). (A NAND is a type of non-volatile storage technology that does not require power to retain data. It exploits negative-AND, i.e. NAND, logic.) For the sake of brevity, an SSD having one or more NAND dies will be used as a non-limiting example of a DSD below in the description of various embodiments. It is understood that at least some aspects described herein may be applicable to other forms of data storage devices as well. For example, at least some aspects described herein may be applicable to a data storage or memory device including phase-change memory (PCM) arrays, magneto-resistive random access memory (MRAM) arrays and resistive random access memory (ReRAM) arrays. In addition, the various embodiments may be used in various machine learning devices which may include some combination of processing elements and memory/data storage elements, including the NVM arrays constructed/configured in accordance with the described embodiments.

Overview

As noted above, there is an unmet need to provide Edge computing devices or nodes that reduce the amount of RAM within the device while still providing adequate volatile memory to meet the needs of Edge computing. Edge nodes often use NVM as a storage media, such as by using so-called flash NAND devices (where NAND refers to a Negative-AND storage architecture). Cost-savvy storage flash NAND devices have limited internal static RAM (SRAM). However, irrespective of cost of the storage device, NAND flash devices have NVM memory dies that include staging buffers called latches. The latches are volatile memory components of the die that provide an on-chip volatile working memory for use by circuitry of the memory die. Latches are mostly used during read and write (program) operations, wherein for write operation data from a host device is written to NVM storage elements of the die (under the control of a data storage controller coupled to the memory die) and later read from the storage elements. For write (program) operation, the controller fills one or more of the latches and then issues a program command. Each die has its own set of latches. During times when the memory die is not performing storage operations (e.g., read, write, or related operations such as fold operations), the data latches are typically idle. Often, a NAND flash device will include an entire array of NVM dies such as, for example, sixty-four dies. The latches of all of the memory dies of the NVM array collectively provide a substantial amount of volatile memory, which, as noted, is unused when the dies are not actively performing NVM storage operations.

Herein, systems, methods and architectures are described that, in some aspects, use the latches of NVM dies as volatile memory, at least when the latches are not used for on-going NVM storage operations. That is, at least some latches of a die are included within a volatile memory portion of an overall memory space, such as a host memory space or a memory space of the data storage controller, so that the latches may be used for RAM storage via RAM read or write commands. Making latches available for use as volatile memory by the host is referred to herein as "exporting" the latches to the host. The mode of operation wherein latches are used as volatile memory by the host or by the DSD controller is referred to herein as a "latch volatile memory (VM) mode" but may also be referred to using other terminology such as a latch RAM mode.

In some examples, the data storage controller of the DSD dynamically determines when the latches of a particular NVM die of an NVM array of the DSD are available for use as volatile memory (e.g., whether latch VM mode can be activated) and then exports those particular latches for use as volatile memory when available. For instance, the determination may be made based on whether particular latches are needed for on-going single-level cell (SLC) or multi-level cell (MLC) storage element operations. When SLC storage operations are performed, some of the latches may be free for use as RAM, cache memory, etc. Note that herein the term "MLC" refers to two or more levels per cell, and hence the term MLC encompasses triple-level cells (TLC), quad-level cells (QLC), etc.

In other examples, the data storage controller selects some of the memory dies of the NVM array for use exclusively as latch-based VM storage. That is, the selected memory dies are not used to store data within their NVM storage elements. Rather, the selected memory dies are used exclusively as latch-based VM. For instance, if the NVM array includes sixty-four memory dies, half of the memory dies might be selected for use as latch-based VM, whereas the other half of the memory dies might be employed as conventional NVM storage devices. The data storage controller may rotate NVM die usage so that over time, different dies are used for latch-based volatile memory and different dies are used for NVM storage.

In some aspects, the latch-based volatile memory of the memory dies is reported to (or exported to) the host device for use as part of the host's overall volatile memory space. The host need not know that the memory is within an NVM die since the location of the physical storage elements can be transparent to the host. In other aspects, the latch-based volatile memory of the memory dies is used by the data storage controller as part of its own memory space to supplement its own SRAM (or as a substitute for SRAM if the data storage controller has no SRAM of its own). In some implementations, portions of the latch-based volatile memory are reserved for the data storage controller, and other portions are offered to the host. The host and the data storage controller may negotiate to determine how much of the total available latch memory on an NVM array should be devoted to host memory and how much should be reserved for the data storage controller or for the memory dies themselves. In other examples, the host may send instructions to the data storage controller to control how much, if any, of the latch-based memory is devoted to the host memory space. In still other examples, the data storage controller detects hints within storage commands received from the host and controls the latch-based memory based on the hints, such as by exporting the latches to the host for use as VM when the hints indicate that little or no NVM storage commands are expected and by instead excluding the latches from the volatile memory space if the hints indicate upcoming NVM storage commands will require the use of the latches to store NVM data.

Still further, in some aspects usage profiles may be generated and exploited that control the amount of latch-based memory to export into the volatile memory space. For example, for an Edge computing node that performs an Edge computing procedure, a first usage profile may be used during a heavy computation phase of the Edge computing procedure and a second usage profile may be used following completion of the computation phase. The first usage profile may exploit more of the latches as VM during the computation phase to facilitate completion of the computations by the data storage controller of the Edge node. The second usage profile may devote more of the latches to NVM storage operations following the computation phase to facilitate storage of the computed data within NVM storage elements.

The storage devices and procedures described herein may be referred to as dual usage storage devices because the latches of a particular die may be used for NVM storage operations at some times and, at other times, the latches may be used as volatile memory accessible by the host. In a system with multiple dies, the DSD can thereby support both volatile and non-volatile storage operations at the same time (with volatile storage operations performed within the latches of some of the dies and with NVM storage operations performed concurrently in other dies of the NVM array). When used as volatile memory by the host or DSD controller, the latches may be used for a wide variety of VM storage needs, such as for use as RAM, caches, read look-ahead (RLA) buffers, etc.

The dual usage procedures described herein can be exploited within Edge computing and artificial intelligence ecosystems, particularly where a computational phase (e.g. model training phase) is followed by writing output to the NVM. However, the systems and procedures described herein are not limited to Edge computing or artificial intelligence.

These and other aspects will now be described in greater detail.

Exemplary Data Storage Device with Dual Mode Dynamically Configurable Memory

FIG. 1 is a block diagram of a system 100 including an exemplary SSD (or DSD) having an NVM with latch-based volatile memory control components. The system 100 includes a host 102 and an SSD 104 or other DSD coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device with a need for data storage or retrieval and a compatible interface for communicating with the SSD 104. For example, the host 102 may be a computing device, a personal computer, a portable computer, a workstation, a server, a personal digital assistant, a digital camera, or a digital phone as merely a few examples. Additionally or alternatively, the host 102 may be a system or device having a need for neural network processing, such as speech recognition, computer vision, and self-driving vehicles. For example, the host 102 may be an Edge computing node or device or a component of an artificial intelligence system.

The SSD 104 includes a host interface 106, an SSD/DSD controller 108, a working memory 110 (such as SRAM or DRAM) or other working memory, an NVM interface 112 (which may be referred to as a flash interface), and an NVM array 114, such as one or more NAND memory dies configured to store data within NVM storage elements. The NVM array 114 also includes on-chip volatile latches, which may be used by the memory dies to facilitate NVM storage operations or which may be used by the DSD 104 or host 102 as volatile memory during VM mode operations in accordance with aspects disclosed herein. For example, the latches may be included within the memory space of the host for use as a portion of RAM or may be included within the memory space of the controller of the DSD for use as RAM. In some examples, the latches included within the volatile memory space of the host are latches along the read/write (or write/read) path of the memory die. The read/write path is a data path to NVM elements of a memory die from which or to which data associated with a read or write command travels through. Memory dies may have other latches that are not along the read/write path. In other examples, any of the latches on the memory die might be included within the volatile memory space of the host. The various latches included within the host volatile memory space may be used to store host data that would otherwise not be stored on the memory die, such as data that would otherwise be stored in RAM. Hence, the data stored in the latches as part of the host volatile memory space may be data that is not in the process of being stored in the NVM elements of the memory die.

The host interface 106 is coupled to the controller 108 and facilitates communication between the host 102 and the controller 108. The controller 108 is coupled to the working memory 110 as well as to the NVM array 114 via the NVM interface 112. The host interface 106 may be any suitable communication interface, such as a Non-Volatile Memory express (NVMe) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link.

Although, in the example illustrated in FIG. 1, SSD 104 includes a single channel between controller 108 and NVM die(s) 114 via interface 112, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The controller 108 may be implemented in a single integrated circuit chip and may communicate with different layers of memory in the NVM die(s) 114 over one or more command channels.

The controller 108 controls operation of the SSD 104. In various aspects, the controller 108 receives commands from the host 102 through the host interface 106 and performs the commands to transfer data between the host 102 and the NVM array 114. Some of the data may be stored within NVM storage elements of the NVM array 114, whereas other data may be stored in the latches of the memory dies. Furthermore, the controller 108 may manage reading from and writing to working memory 110 to perform various functions effected by the controller and maintain and manage cached information stored in memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The working memory 110 may be any suitable memory, computing device, or system capable of storing data. For example, the working memory 110 may be ordinary RAM, DRAM, double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the working memory 110, or a portion thereof, to store data during the transfer of data between the host 102 and the NVM array 114. For example, the memory 110 or a portion of the memory 110 may be a cache memory. The NVM array 114 receives data from the controller 108 via the NVM interface 112 and stores the data. The NVM array 114 may be any suitable type of non-volatile memory, such as a NAND-type flash memory or the like. In some embodiments, working memory 110 may be replaced by a non-volatile memory such as MRAM, PCM, ReRAM, etc. to serve as a working memory for the overall device.

In the example of FIG. 1, the controller 108 may include hardware, firmware, software, or any combinations thereof that control the use of latches within the dies of NVM array 114 for use as volatile memory within the latch VM operating mode. For example, the controller 108 may include a latch VM mode controller 116 configured to determine whether particular latches within the NVM array 114 are available for use within a volatile portion of the memory space of either the host or the SSD 104. In some embodiments, the functions of the latch VM mode controller 116 are performed by the controller 108 itself. In response to a determination the latches are available for use as volatile memory, the latch VM mode controller 116 enables or configures the latches for use as a portion of the volatile memory space and then stores/retrieves data to/from the latches. In response to a determination the latches are not available for use within the volatile memory space, the latch VM mode controller 116 exclude the latches from the volatile memory space. Depending on the configuration of the memory dies, enabling the latches may involve sending suitable commands to the memory die to enable the usage of the latches as volatile memory by the host. Depending on the configuration of the SSD, enabling the latches may also involve configuring internal VM mapping tables, caches, flash translation layer (FTL) tables, etc., within the SSD to facilitate the usage of the latches of the NVM array as host accessible VM. For example, as will be explained more fully below, the SSD may maintain a logical block address (LBA)/latch mapping table that maps a host LBA logical address to a particular latch within a particular memory die where the host data is stored.

Although FIG. 1 shows an example SSD and an SSD is generally used as an illustrative example in the description throughout, the various disclosed embodiments are not necessarily limited to an SSD application/implementation. As an example, the disclosed NVM die and associated processing components can be implemented as part of a package that includes other processing circuitry and/or components. For example, a processor may include, or otherwise be coupled with, embedded NVM and associated circuitry and/or components for processing as described herein. The processor could, as one example, off-load certain processing tasks to the NVM and associated circuitry and/or components. As another example, the controller 108 may be a controller in another type of device and still include the controllers 108 and/or 116 and perform some or all of the functions described herein.

Figure 2:
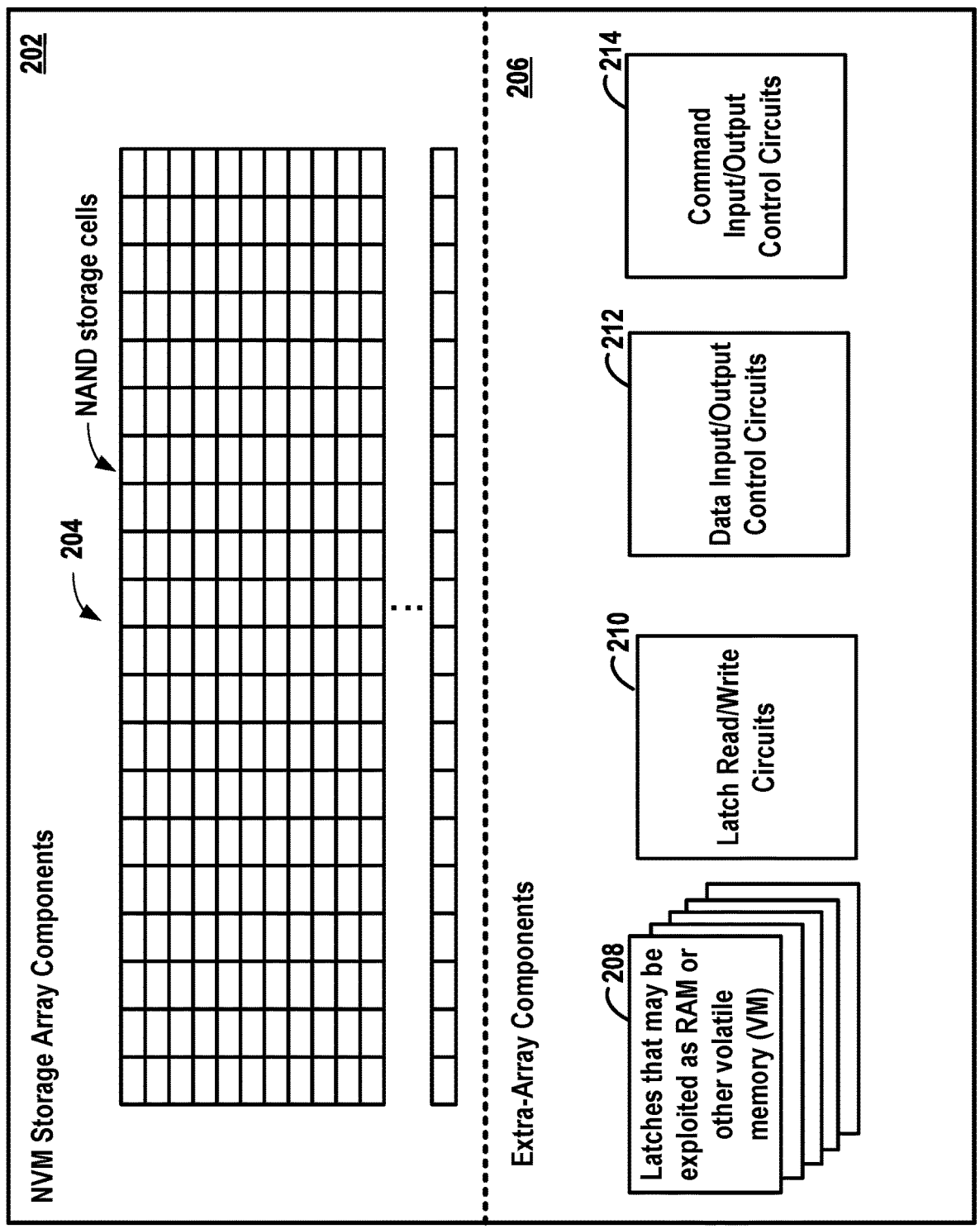
FIG. 2 illustrates an exemplary NVM array die that includes latches that may be used as VM by the host or DSD, i.e. latch-based VM storage is enabled.

FIG. 2 is a block diagram illustrating an exemplary NVM die 200 that includes NVM storage array components 202 include NAND storage cells 204, which may be arranged in word lines, blocks, or the like. The exemplary NVM die 200 also includes extra-array processing components 206, which are referred to herein as "extra-array" because they are not part of the NAND array 204. The extra-array components 206 may be configured, for example, as under-the-array or next-to-the array circuit components. In the example of FIG. 2, the exemplary extra-array processing components 206 include: a set of latches 208, latch read/write circuits 210 for writing data into the latches 208 and reading the data out of the latches 208; data input/output control circuits 212 for inputting data from the data storage controller (e.g. controller 108 of FIG. 1) and outputting data to the data storage controller; and command input/output control circuits 214 for inputting commands from the data storage controller, e.g. NVM read commands or write (program) commands and for outputting signals indicating completion of the commands (or error indicators if, for some reason, a particular command is not executed). Not all circuit or memory components that might be used in a practical NVM die are illustrated in the figure, such as voltage regulation components, clocks and timing components, etc. Rather only some components and circuits are shown, summarized as blocks.

Figure 3:
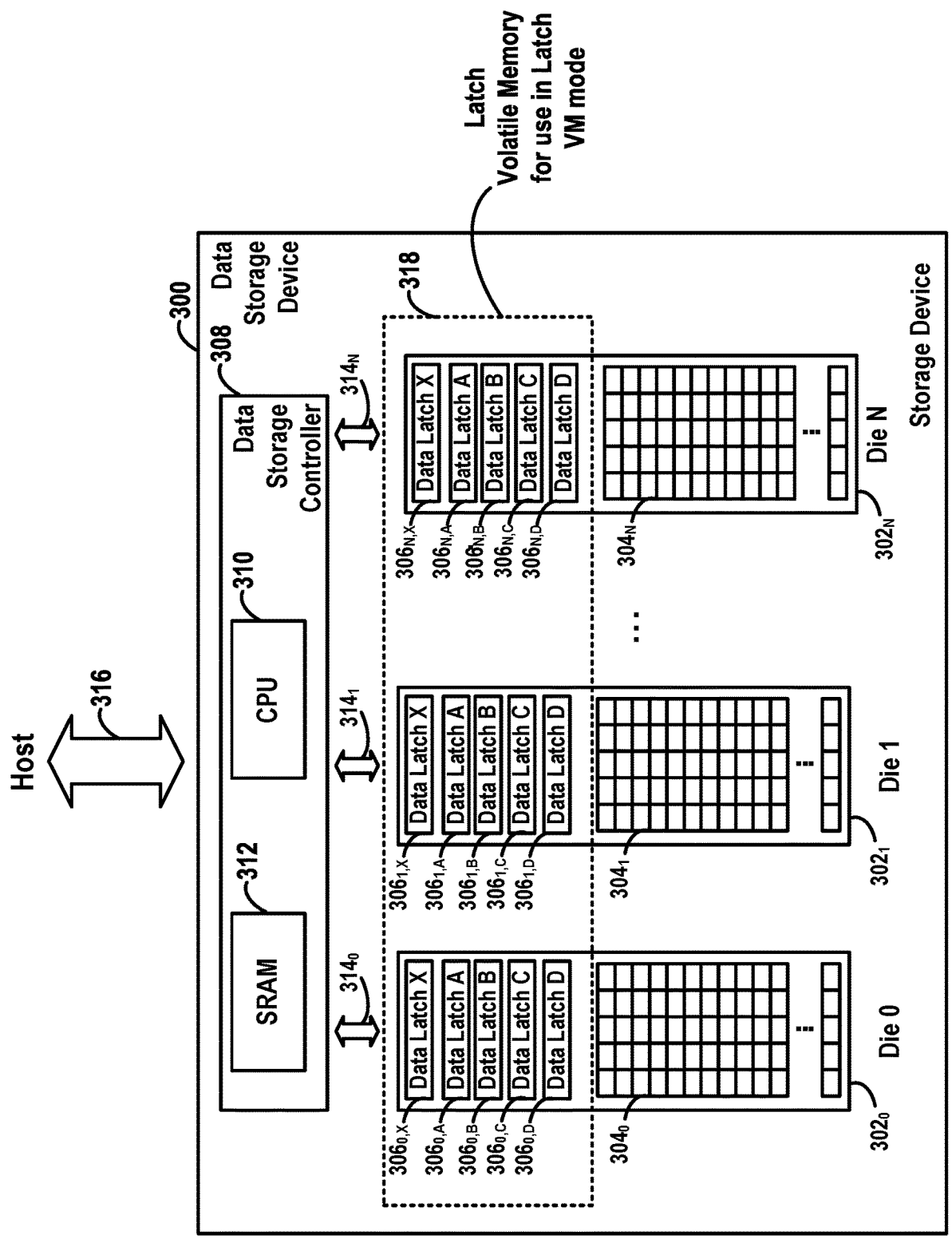
FIG. 3 illustrates an exemplary NVM system having an array of memory dies, each including latches that may be selectively used for latch-based VM storage.

FIG. 3 is a block diagram illustrating an exemplary DSD 300 having a set of memory dies, where each die includes latches or buffers that may be used as volatile memory. In particular, DSD 300 includes a set of NAND memory dies $302_{0...N}$, each of which includes a set of NAND storage cell blocks $304_{0...N}$, and a set of five latches X (or XDL), A (or ADL), B (or BDL), C (or CDL), and D (or DDL), individually denoted $306_{1...N,X}$, $306_{1...N,A}$, $306_{1...N,B}$, $306_{1...N,C}$, and $306_{1...N,D}$. The designations of latches (XDL, ADL, BDL, CDL, and DDL) is arbitrary and other names or designations may be given to the latches. Although five latches are provided per die in this example, in other systems more or fewer latches may be included in each memory die. The DSD 300 also includes a data storage controller 308 having a CPU 310 and an SRAM 312. Each of the memory dies is $302_{0...N}$ is coupled to the data storage controller 308 by a separate connection channel or bus $314_{0...N}$. The DSD 300 is coupled to a host via a connection channel or bus 316. Dashed line 318 illustrates the total latch-based volatile memory (e.g. RAM) available within the DSD 300, at least a portion of which may be made available within the memory space of the host for use by the host as VM.

Note that the XDL latch may be referred to as a transfer data latch, and the ADL, BDL, CDL, and DDL latches may be referred to as auxiliary MLC latches. When instructed by the host to write data to a memory block (such as storage cell block $304_0$ of Die 0), the controller 308 transfers data to the XDL latch of the die. Circuit components within the die (no shown) then write or program the data from the XDL latch to the specified memory block. By way of example and without limitation, the size of the XDL, ADL, BDL, CDL and DDL latches are each equal to the size of an SLC memory page. Hence, for an SLC write, data may be stored in XDL, then programmed to an SLC page. For a TLC write, data may be written into ADL, BDL and CDL, then programmed into a TLC page. For a QLC write, data may be written into ADL, BDL, CDL, and DDL, then programmed into a QLC page. Thus, when SLC writes are performed, ADL, BDL, CDL and DDL are free for use as latch VM by the host. When TLC writes are performed, DDL is free for use as a latch VM by the host. In this manner, at least some latches may be available for use as volatile memory for the host even when other latches on the same die are busy with NVM data transfers.

Note that each of the NVM dies has Read/Write speed called a Die Read/Write Throughput. Many dies working in parallel increases device throughput. For example, a Bit Cost Scaling (BiCS)×3 device provides: Die Program Throughput=96 KB/1.5 ms=64 MBps; Die Read Throughput=32 KB/90 us=350 MBps; Device Throughput for 32 die in parallel; Program Throughput=32*64 MBps=2 GBps; and Read Throughput=32*350=10 GBps (although the read throughput might be capped by protocol throughput limitations). In the example of a BiCS6×4 device, the device has four laches per die and each die has four planes of 16 KB each. Hence, the total size of laches per die=16K*4(planes) *4(latches)=256K. Assuming a flash device of sixty-four dies, the total latch buffer space available is 64*256 KB or 16 MB. Moreover, an artificial intelligence eco-system working on large data sets may have many flash devices connected to it and, in such as system, all of the device can be configured to export volatile space to a central host to form a large VM storage pool.

Note also that each storage device (e.g. DSD) usually must adhere to power restrictions. A storage device cannot draw power from source beyond some agreed value. NVM dies often are main power consumers in a storage device. Hence, typically in a large capacity device only few dies are active at a time (e.g. out of 64 dies, only 16 are active at any point of time). However, power is consumed by dies when they are performing NAND cell level operations (either programming a cell or reading data from the cell). Operating on latches takes a fraction of the power of actual NAND cell operations. Hence, in a "volatile mode," the DSD may activate all dies at same time to increase device volatile RAM capacity without significant power increases since NAND reads/writes are not performed.

Figure 4:
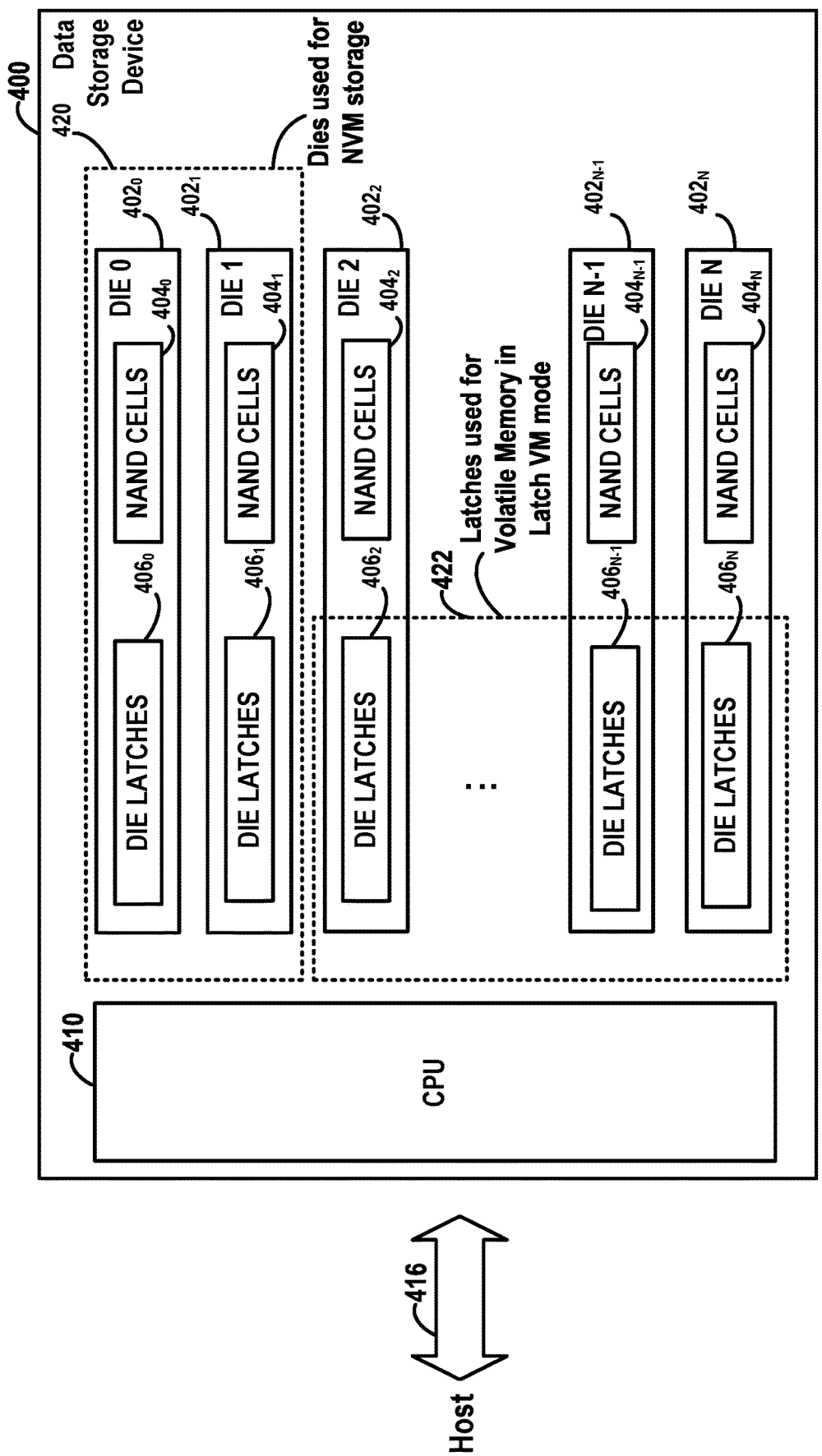
FIG. 4 illustrates another exemplary NVM system having an array of memory dies, each including latches that may be selectively used for latch-based VM storage.

FIG. 4 is a block diagram illustrating an exemplary DSD 400 having a set of memory dies, where as in FIG. 3 each die again includes latches. In the example of FIG. 4, some of the dies are used for normal NVM storage, whereas other dies are used only for volatile memory. The DSD 400 includes a set of memory dies $402_0 \ldots _N$, each of which includes NAND storage cell blocks $404_1 \ldots _N$ and set of latches $406_1 \ldots _N$. A first group or portion 420 of the memory dies shown in dashed lines (specifically DIE 0 and DIE 1) are used for normal NVM storage. That is, the latches within the memory dies of group 420 are used in connection with the storage and retrieval of data to and from the NAND cells of those dies and are not used as volatile memory within the memory space of the host. A second group or portion 422 of the memory dies shown in dashed lines (specifically DIE 2 through DIE N) are not used for NVM storage. Rather, the latches within the memory dies of group 422 are used as volatile memory within the memory space of the host. The NAND cells within the group 422 are not used for storage of data. The DSD 400 also includes a CPU 410. No SRAM is shown since, in the example of FIG. 4, the DSD 400 uses the latches of the second group 422 of memory dies as RAM or other VM. In other examples, SRAM might also be provided. It is noted that in systems where the DSD has its own SRAM, it may be inadvisable to expose the SRAM to host (for use as VM by the host) as this could affect normal read/write operations (e.g., SRAM caches, FTL tables/data structures, and the like might thus be unavailable, which could trigger extra NAND operations). The DSD 400 is coupled to a host via a connection channel or bus 416. Connection channels between the dies and the CPU are not shown but are also provided (as shown in FIG. 1).

In other examples, the particular memory dies that are devoted to NVM storage (group 420) and the particular memory dies that are devoted to volatile storage (group 422) may be changed over time. For example, the CPU 410 may periodically select a different set of memory dies (e.g. DIES N and N−1) for use as NVM storage (with their latches thus removed from the volatile memory space) so that the original set of NVM storage dies (e.g. DIES 0 and 1) may have their latches added into the volatile memory space. At that time, any data stored in the NAND cells of the first group 420 of memory dies is moved into the NAND cells of the other memory dies. In this manner, wear within the NAND cells of the memory dies may be spread out over the entire set of memory dies over time. For example, over the lifetime of the device 400, each of the memory dies may spend about an equal amount of time as NVM storage dies and about an equal amount of time as volatile memory devices. Although the particular example of FIG. 4 shows that two of the memory dies are used as NVM dies while the rest of the dies are used as volatile memory, the number of dies used for NVM and the number of dies used for volatile memory may, of course, differ depending, for example, on the storage needs of the host. If a larger amount of data needs to be stored in NVM, then more of the dies may be devoted to NVM. If a smaller amount of data needs to be stored in NVM, then fewer of the dies may be devoted to NVM. In some examples, 64 totals memory dies are provided. The allocation may be changed dynamically based on current needs of the host and the data storage controller and based on the status of the memory dies, such as their age and degree of wear.

Figure 5:
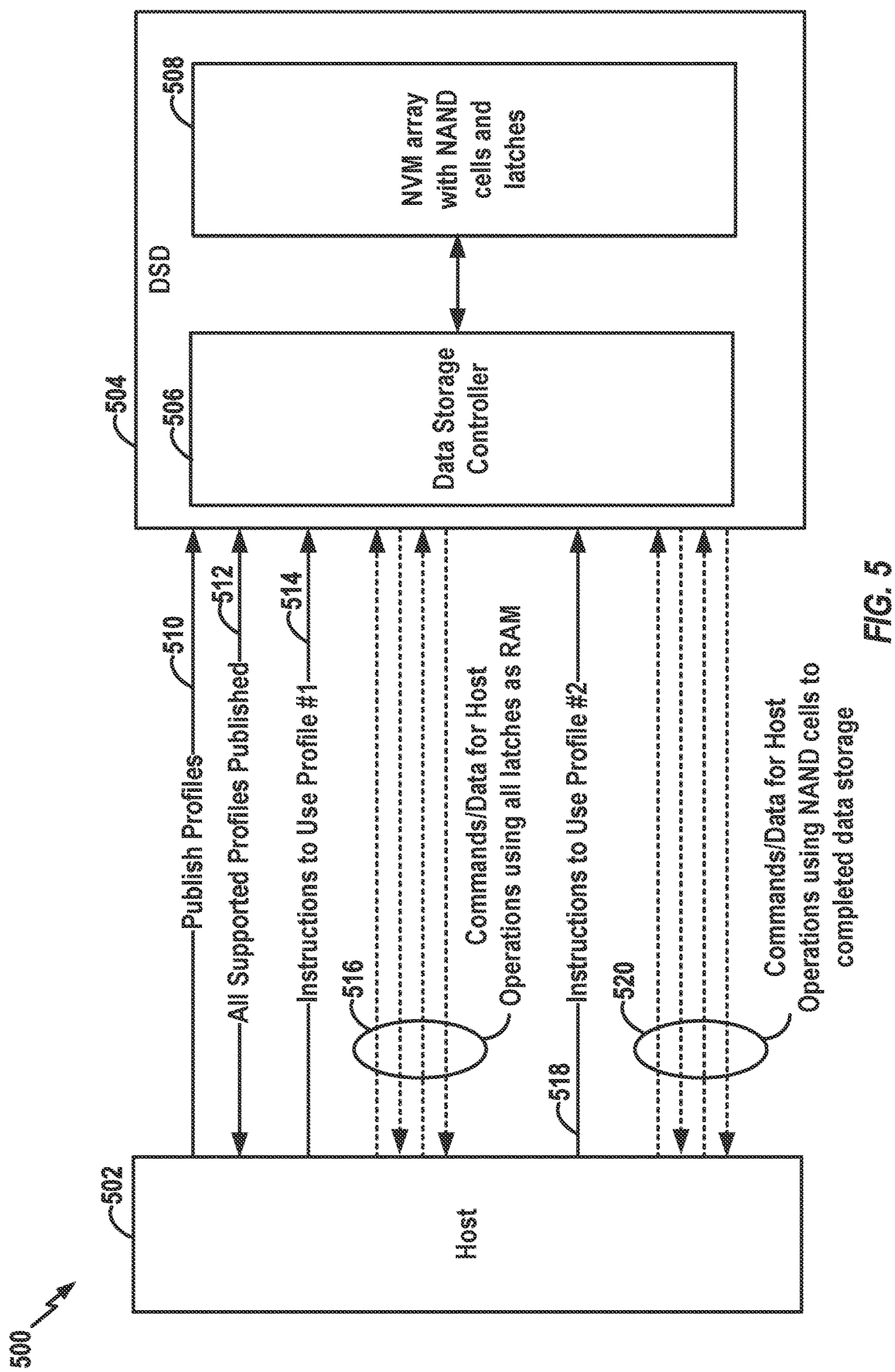
FIG. 5 illustrates another exemplary NVM system having an array of memory dies, and particularly illustrating the use of usage profiles to control latch-based VM storage.

FIG. 5 is a block diagram illustrating an exemplary system 500 wherein allocation or usage profiles are employed to dynamically control the allocation of memory die latches to a volatile memory space of the host. The system 500 includes a host 502 and a DSD 504 that includes a data storage controller 506 and an NVM array having NAND cells and latches that are dynamically allocatable to RAM or to NAND storage operations. The DSD 504 may include other components, not shown, such as internal busses.

At 510, the host publishes one or more latch VM usage profiles to the DSD and, at 512, the host and DSD negotiate to determine or select a set of supported profiles. The profiles may specify, for example, different allocations of the total amount of latch VM that the host may wish to use at different times. One profile may request that all of the latch memory be devoted to VM. Another profile may request that none of the latch memory be devoted to VM and with all latches instead devoted to NAND storage operations. Other profiles may request intermediate percentages or VM vs non-VM. Still other profiles may specify that only SLC latch storage be used within the NVM arrays (rather than MLC latch storage) so that latches associated with MLC storage operations may be allocated to VM while latches needed for SLC are devoted to SLC storage operations. As explained above, while performing SLC operations (non-cached), only one of the latches of the die is used. During SLC operations, other latches of the die can be used as RAM for host operations. Hence device profiles may take this into account (e.g. a die can export some latches to the host while also be performing SLC operations) with dies supporting both flash and non-volatile operations at same time. Different profiles may be defined for SLC, TLC, QLC, etc.

These are just some examples of profiles. In some cases, one or more of the profiles published by the host to the DSD may not be supported by the DSD, and so the DSD identifies the profiles that are supported. By way of example, if the DSD is near its end of life so that significant portions of its NAND arrays are no longer usable, then profiles requested by the host that require large amounts of NAND might no longer be supported by the DSD. Note that the procedures of 510 and 512 may be regarded as a negotiation phase of the overall procedure, which serves to negotiate a supported set of profiles.

At 514, the host provides commands or instructions to the DSD to control the DSD to use a particular one of the profiles. In the example of FIG. 5, the host specifies Profile #1, which indicates that all of the latches of the NVM array are to be devoted to VM. This may be appropriate if the host is performing computationally intensive operations that require a large amount of VM. The controller 506 of the DSD 504 then configures its internal components (such as its LBA/latch mapping tables, caches, FTL tables, etc.) and internal components of NVM array 508 accordingly to devote all latches in all of the memory dies to the volatile memory space of the host. At 516, commands and data are sent from the host to the DSD that exploit the latch VM memory space, and responsive replies (e.g. command completion responses) and return data are sent from the DSD to the host. In one particular example, if the host is configured to perform machine learning, the first profile (Profile #1) may be used during an initial computationally intensive training phase during which time the host trains a neural network. For instance, the neural network may be trained for image recognition.

At 518, the host then provides commands or instructions to the DSD to control the DSD to use a different profile. In the example of FIG. 5, the host specifies Profile #2, which indicates that none of the latches of the NVM array is to be devoted to VM so that all of the memory dies may be devoted to storing data in the NAND cells of the NVM array. This may be appropriate following completion by the host of the computationally intensive operations so that the final computed data may be stored in NVM. The controller 506 of the DSD 504 then reconfigures its internal components (if needed) and the internal components of NVM array 508 accordingly to devote all latches in all of the memory dies to NVM storage operations, including any needed SLC or MLC storage operations. At 520, commands and data are sent from the host to the DSD to store the computed data within the NAND cells of the NVM array 508, and responsive replies (e.g. command completion responses) and any return data are sent from the DSD to the host. In the example where the host is configured to perform machine learning, the second profile (Profile #2) may be used following completion of the training phase to store trained neural network data in the NVM array, such as trained image recognition data. Such trained data may include final computed values for synaptic weights or the like.

For Edge computing, the first profile (Profile #1) may be used during a computation phase when the Edge node is operating on large amounts of data and requires considerable RAM (such as when a processor of the Edge node performs the computation phase of an Edge computing procedure). When the computation operation is finished, the Edge node may need to store its computed data to the NVM array with high NAND Write throughput/Speed, and hence the device would use the second profile (Profile #2). As noted, an entire set of different profiles may be specified. That is, to cater to dynamic host requirements, the DSD may publish various combinations of non-volatile operation throughput and exportable RAM to the host. The host, depending on its current use case, may then choose any of the supported profiles. In an illustrative example, the DSD may have four dies, the NAND operation (non-volatile) throughput of one die may be 100 MBps; and the number data latches within one die may equal 256 KB. In this example, the DSD may publish following supported profiles to the host:

TABLE I

| Profile | Non-volatile Throughput (speed) | Host Usable RAM exported by Device |
|---|---|---|
| A | 400 MBps | 0 |
| B | 300 MBps | 256 KB |
| C | 200 MBps | 512 KB |
| D | 100 MBps | 768 KB |
| E | 0 MBps | 1024 KB |

The host can examine the device profiles and choose a profile dynamically. In an illustrative example, Profile E of Table I may be used as the first profile (Profile #1) of FIG. 5 and Profile A of Table I may be used as the second profile (Profile #2) of FIG. 5. Based on a selected profile, the DSD device allocates its dies for NAND or RAM operations accordingly. Within a profile, dies performing NAND operations can be rotated to distribute host data across multiple dies (e.g. meta block manner) to avoid any sequential read performance bottlenecks.

Moreover, although the example of FIG. 5 refers to commands sent by a host that select the usage profile, the profile may alternatively be selected by the data storage controller based on hints obtained from host commands, such as hints conveyed via metadata associated with the commands. Still further, in some examples, the data storage controller selects usage profiles based on its needs, rather than the needs of the host. For instance, if the DSD itself is equipped to perform machine learning processing, then the DSD may select suitable profiles based on its machine learning computational phase. Still further, the DSD may select profiles based on other considerations such as a number of failed blocks or based on bit error rates (BERs) of NAND cells or the like. In this regard, the DSD may switch from one profile that devotes numerous dies to NAND storage to another profile that devotes fewer dies to NAND storage if too many dies become unusable.

Figure 6:
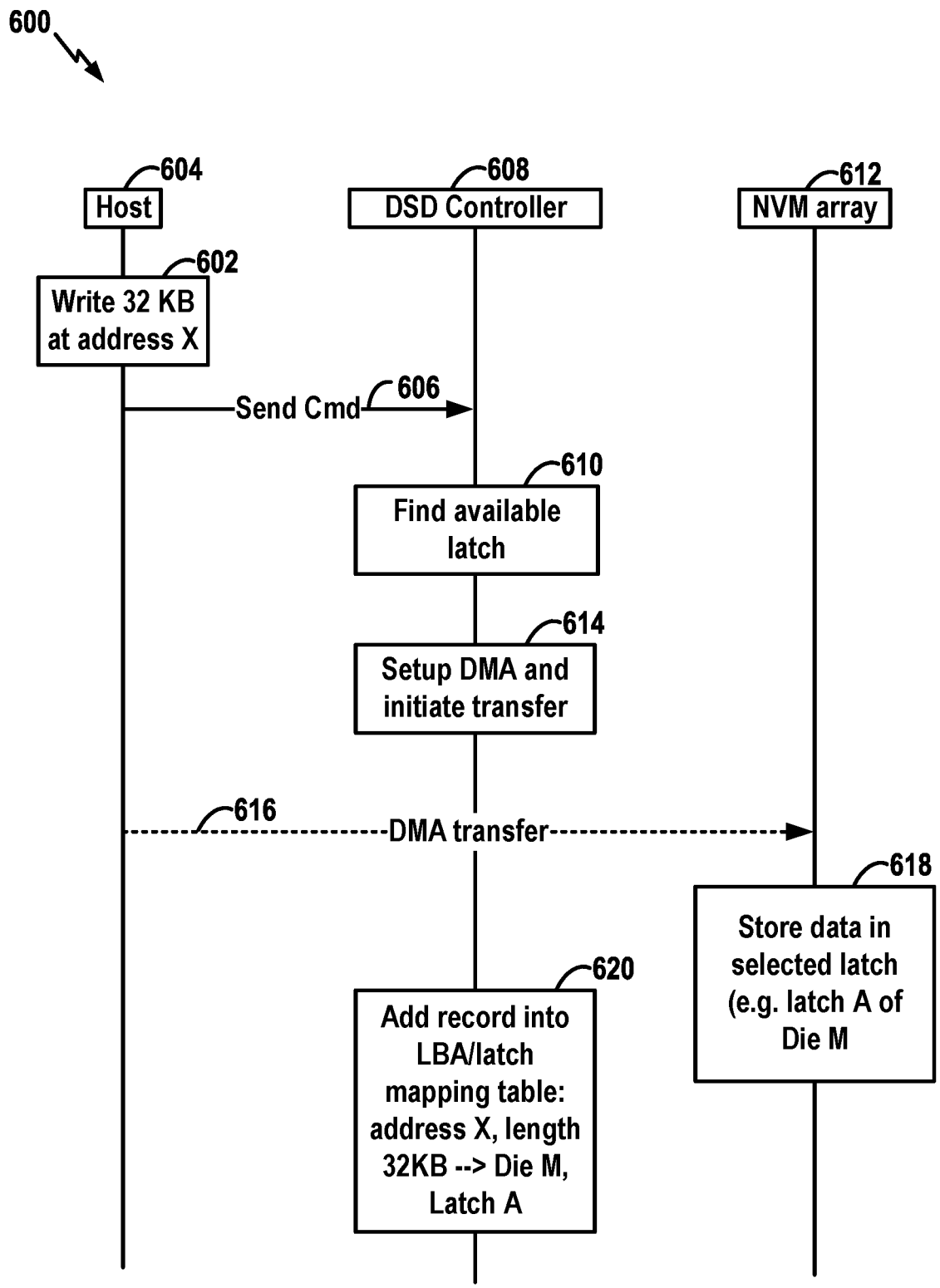
FIG. 6 illustrates an exemplary method for performing latch-based VM writes.

FIG. 6 provide a high level flow (or timing) diagram 600 of a write operation to NVM die latches. At 602, the host 604 initiates a write of an amount of data (e.g. 32 Kbytes) to a particular address (e.g. address X) within its logical address space and, at 606, the host sends a write command to the DSD 608. At 610, firmware of the DSD 608 receives the command and finds or selects an empty (i.e., available) latch among the latches of the NVM array 612. That is, the DSD firmware identifies a particular latch (e.g. latch A) within a particular memory die (e.g. die M) of the NVM array 612. This may be achieved by accessing an LBA/latch mapping table within its internal memory to find a latch that is not already being used for VM and also accessing other mapping tables (such as FTL tables and caches) or other resources to verify that the latch is not being used for processing on-going NVM storage commands).

At 614, the firmware of the DSD 608 sets up a direct memory access (DMA) and initiates the data transfer. At 616, the host data is transferred via the DMA from the host 604 to the selected memory die within the NVM array 612 via DMA components (not shown). At 618, the NVM array stores the data in the selected latch within the selected NVM die using, for example, under-the-array latch write circuitry connected to the latch. At 620, the firmware of the DSD 608 adds or inserts a record into its LBA/latch mapping table, with the record specifying the host address (e.g. address X) and the length of the data (e.g. 32 Kbytes) and linking, mapping, or associating the data with the particular die (e.g. die M) and the particular latch (e.g. latch A). Thereafter, the data can be read back from the latch by specifying the address and the length of the data and then looking up the corresponding latch within the NVM array using the LBA/latch mapping table.

Figure 7:
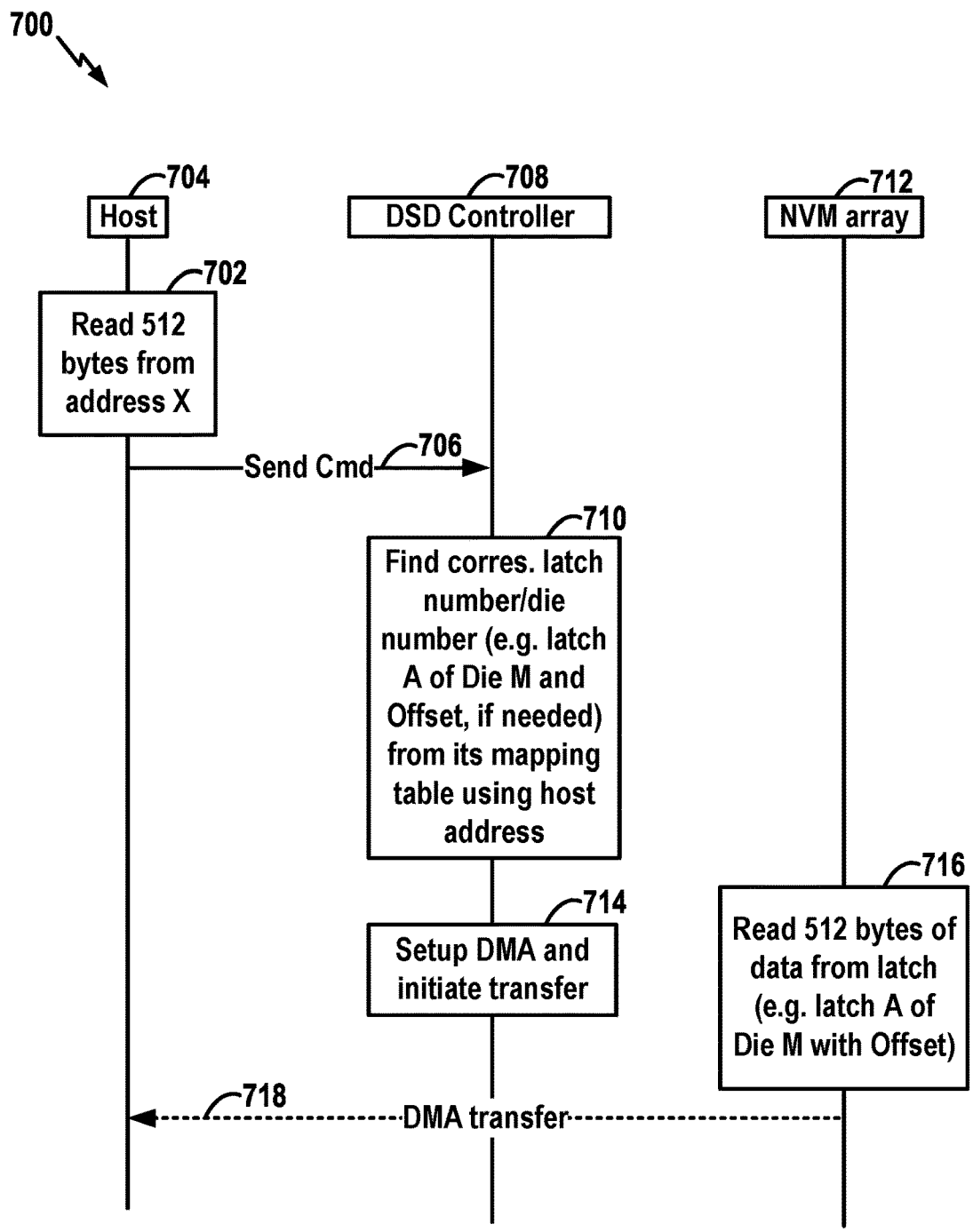
FIG. 7 illustrates an exemplary method for performing latch-based VM reads.

FIG. 7 provide a high level flow (or timing) diagram 700 of a read operation from NVM die latches. At 702, the host 704 initiates a read of an amount of data (e.g. 512 bytes) from a particular address (e.g. address X) within its logical address space and, at 706, the host sends a read command to the DSD 708. At 710, firmware of the DSD 708 receives the command and looks up the corresponding latch number/die number (e.g. latch A of Die M and Offset, if needed) from its mapping table using the host address and size. Note that depending upon the location of the stored data in the latch, an Offset may be used to identify the precise location of the data to be read within the latch. For example, if the latch stores 32 Kbytes of data but only 512 bytes is to be read, those 512 bytes might be located at some offset within the latch, and so the firmware of the DSD 708 computes the offset from the read address received from the host and the address identifying the beginning of the data stored in the latch.

At 714, the firmware of the DSD 708 sets up a DMA and initiates the data transfer. At 716, the data is read from the latch (e.g. 512 bytes are read from latch A of Die M with Offset) and the read data is transferred, at 718, via the DMA to the host. Note that for read operations the data in the LBA/latch mapping table is not updated. Eventually, if the data in the latch is overwritten by other data, the mapping table will be updated at that time to remove the earlier entry or record. (Note that the mapping table is updated when the stored data in the latch is overwritten by new VM data or when the stored data in the latch is overwritten by NVM data during a NAND write (program) operation.)

Insofar as firmware is concerned, in some examples, data is toggled in and out from latches at byte boundary. Even though latches can be accessed at byte level, there may be some additional overhead. Hence, latch VM may be more advantageously used for larger data sets e.g. 16 KB or 32 KB level. A small firmware layer may be provided to maintain a mapping table (discussed below) that keeps a record of die number and latch number where the incoming host address is stored, e.g. Host address X with length 512 bytes→Die 2, Latch A, offset 0.

Figure 8:
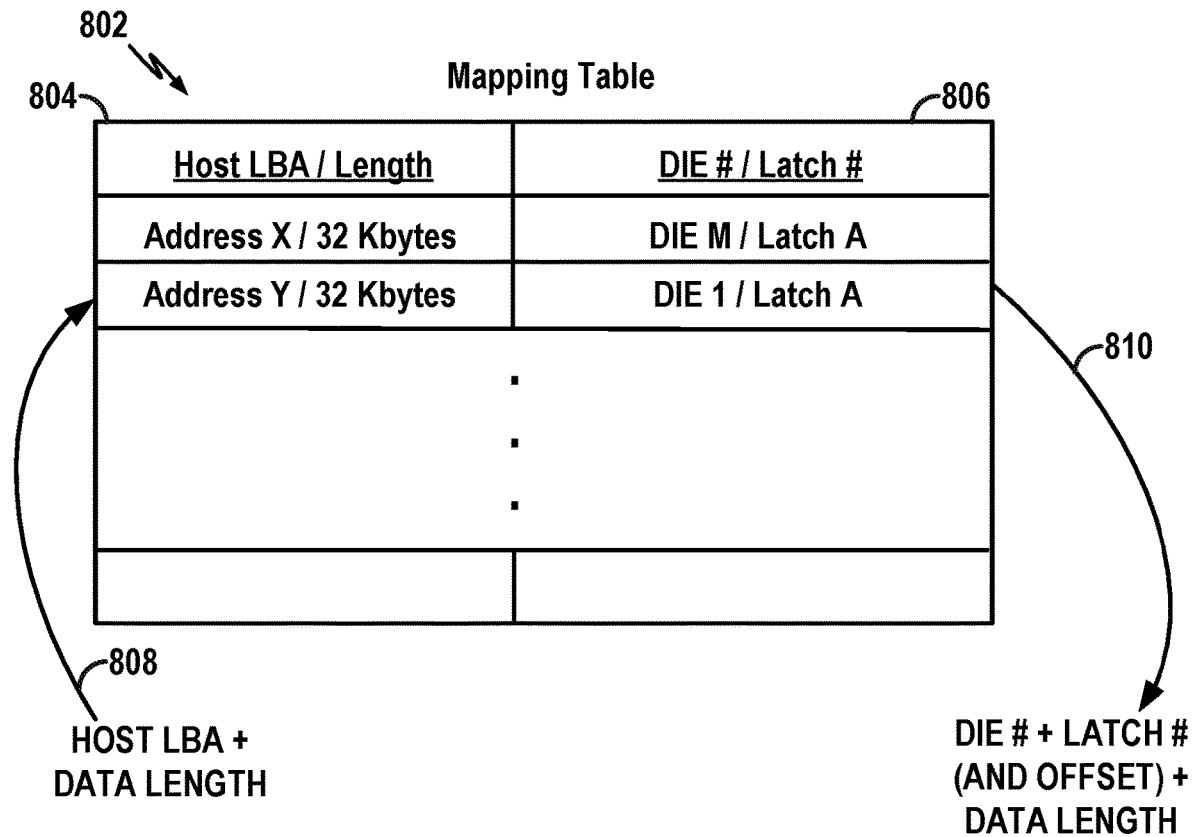
FIG. 8 illustrates an exemplary mapping table for use with latch-based VM storage.

FIG. 8 illustrates an exemplary mapping table 802 that maps host addresses to NVM array latches. This table may be referred to as an LBA/latch mapping table or by other suitable names. A first column 804 identifies the LBA for VM data stored in a latch and its length. A second column 806 identifies the die and the latch. Note that, in some examples, the columns might be split into separate constituent columns (e.g. separate LBA and length columns and separate die and latch columns) or configured in other manners. In use, a host LBA+data length is received 808 within a read command and the table maps those values to the particular die and latch 810 in which the data has been stored. Exemplary values are listed in the table: an address X with 32 Kbytes is mapped to Latch A of Die M; and an address Y, also with 32 Kbytes, is mapped to Latch A of Die 0. The mapping table also outputs the data length. As already noted an offset may be output as well if needed to identify the particular location within a latch where the data is stored. In an illustrative example, if the host wants to read 512 bytes worth of data beginning at Address Z, which corresponds to Address Y+1024 bytes, then the mapping table 802 would output Die 1, Latch A, with an offset of 1024 bytes (and with a length of 512 bytes). Die 1 would then read out 512 bytes of data from its Latch A beginning at that offset, and return the data to the host (via DMA or other suitable transfer mechanism).

Note that the foregoing examples refer to the mapping of host addresses to latch storage locations within an NVM array to allow host to read and write to the latches as though the latches were part of host VM. That is, the latches become part of the memory space of the host. In other examples, the data storage controller maps its internal addresses to latch storage locations within an NVM array to allow the data storage controller to read and write to the latches as though the latches were part of the DSD VM. That is, the latches become part of the memory space of the DSD, not the host. In other examples, the latches might be mapped into other memory spaces, such as the memory space of a dedicated processing component of the DSD, such as a dedicated machine learning processor within the DSD.

Figure 9:
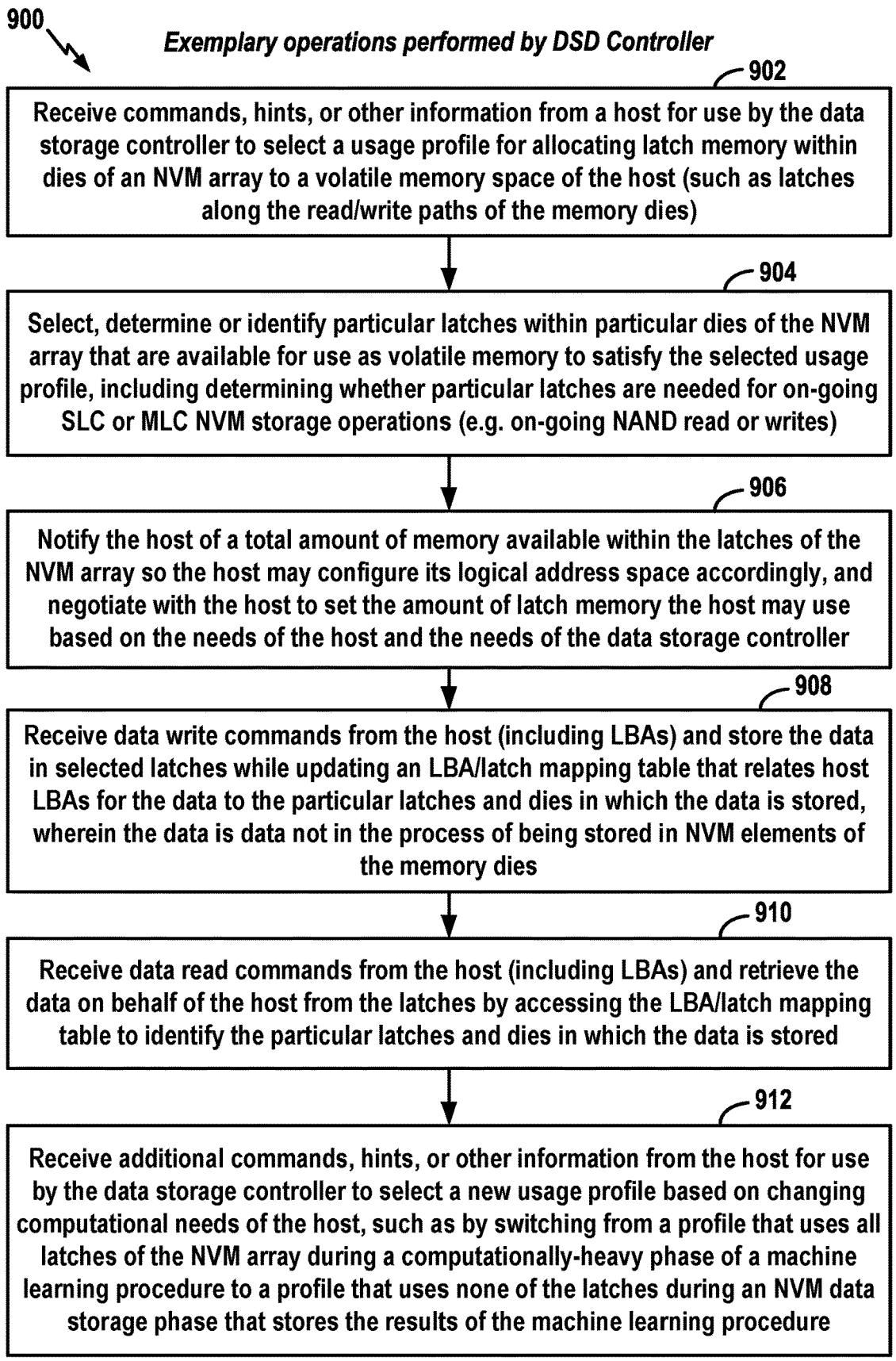
FIG. 9 illustrates an exemplary method for use by a DSD for use with latch-based VM storage.

FIG. 9 illustrates an exemplary method 900 for use by a DSD controller having an NVM memory array with latches that can be allocated for use as volatile memory. Beginning at block 902, the data storage controller receives commands, hints, or other information from a host for use by the data storage controller to select a usage profile for allocating latch memory within dies of an NVM array to a volatile memory space of the host (such as the latches along the read/write paths of the memory dies). At block 904, the data storage controller selects, determines or identifies particular latches within particular dies of its NVM array that are available for use as volatile memory to satisfy the selected usage profile, including determining whether particular latches are needed for on-going SLC or MLC NVM storage operations (e.g. on-going NAND read or writes). At noted above, MLC storage operations use latches than SLC storage operations. At block 906, the data storage controller notifies the host of a total amount of memory available within the latches of the NVM array so the host may configure its logical address space accordingly. At block 906, the data storage controller may also negotiate with the host to set the amount of latch memory the host may use based on the needs of the host and the needs of the data storage controller.

At block 908, the data storage controller receives data write commands from the host (including LBAs) and stores the data in selected latches while updating an LBA/latch mapping table that relates host LBAs for the data to the particular latches and dies in which the data is stored, wherein the data is data not in the process of being stored in NVM elements of the memory dies. Later, at block 910, the data storage controller receives data read commands from the host (including LBAs) and retrieves the data on behalf of the host from the latches by accessing the LBA/latch mapping table to identify the particular latches and dies in which the data is stored. As already explained, DMAs may be used to transfer data to or from the host to satisfy write or read commands. At block 912, the data storage controller receives additional commands, hints, or other information from the host for use by the data storage controller to select a new usage profile based on changing computational needs of the host, such as by switching from a profile that uses all latches of the NVM array during a computationally-heavy phase of a machine learning procedure performed by the host to a profile that uses none of the latches during an NVM data storage phase that stores the results of the machine learning procedure in NAND cells of the NVM array.

Figure 10:
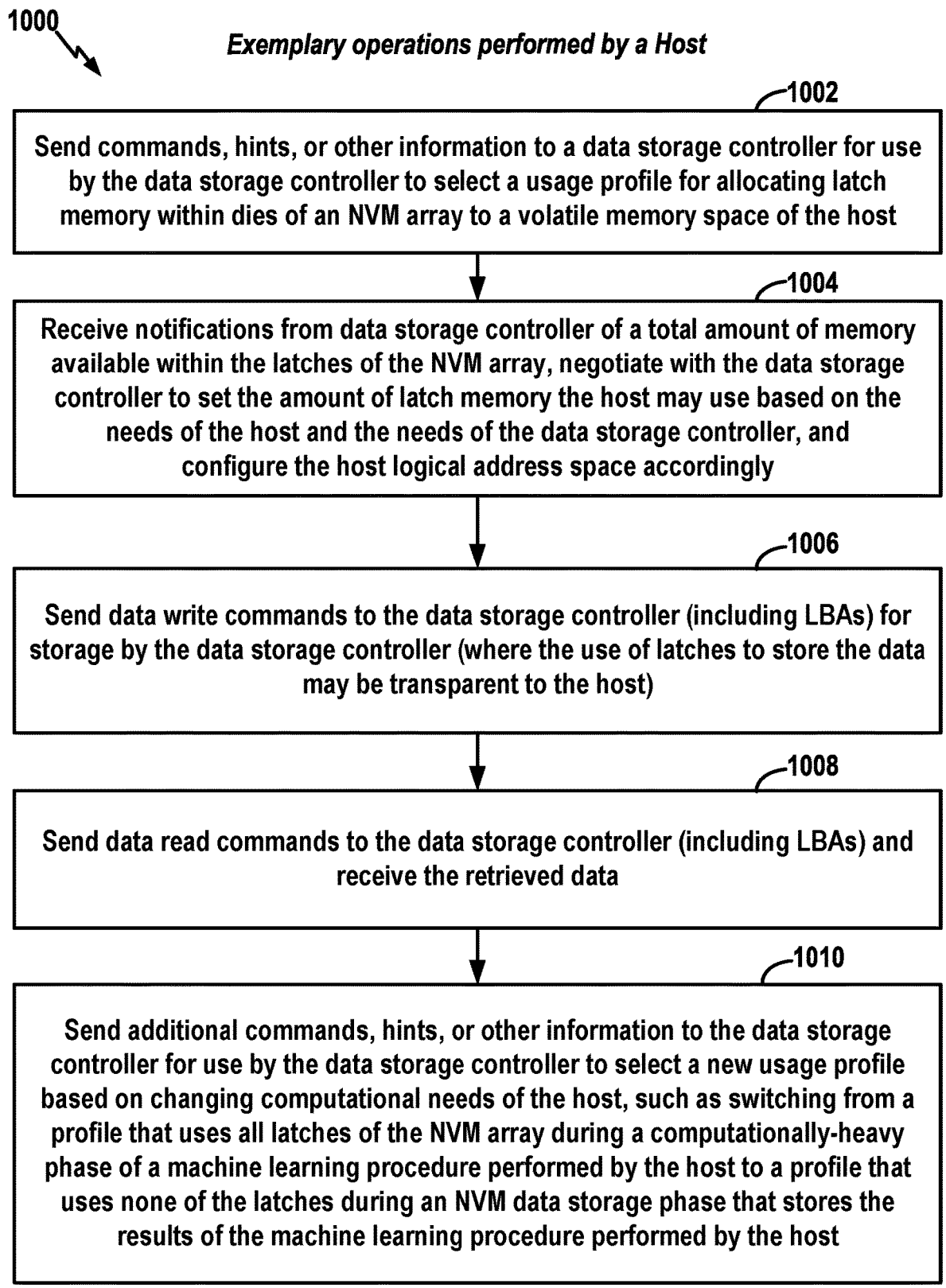
FIG. 10 illustrates an exemplary method for use by a host for use with latch-based VM storage.

FIG. 10 illustrates an exemplary method 1000 for use by a host for use with latch-based VM storage. Beginning at block 1002, the host sends commands, hints, or other information to a data storage controller (e.g. a DSD controller) for use by the data storage controller to select a usage profile for allocating latch memory within dies of an NVM array to a volatile memory space of the host. At block 1004, the host (a) receives notifications from data storage controller of a total amount of memory available within the latches of the NVM array, (b) negotiates with the data storage controller to set the amount of latch memory the host may use based on the needs of the host and the needs of the data storage controller, and (c) configures the host logical address space accordingly. At block 1006, the host sends data write commands to the data storage controller (including LBAs) for storage by the data storage controller (where the use of latches to store the data may be transparent to the host). Later, at block 1008, the host sends data read commands to the data storage controller (including LBAs) and receives the retrieved data. At block 1010, the host sends additional commands, hints, or other information to the data storage controller for use by the data storage controller to select a new usage profile based on changing computational needs of the host, such as switching from a profile that uses all latches of the NVM array during a computationally-heavy phase of a machine learning procedure performed by the host to a profile that uses none of the latches during an NVM data storage phase that stores the results of the machine learning procedure performed by the host.

Insofar as error correction is concerned, since there is no NAND flash involvement in latch VM operations, NAND errors are not introduced when using latches for VM. Moreover, RAM and latches adhere to DPPM (defect parts per million) specifications and undergo testing accordingly. Latch VM access thus may be covered under the same DPPM and no further protection is required. Note also that latch DPPM is comparable to SRAM/DRAM.

Insofar as read/write speed from/to the latches is concerned, to transfer data to or from die latches, there may be an approximately 4-5 micro second (μs) entry one time penalty. The 5 μs penalty is for full die latch worth of data. For a two plane die, data toggle speed may be 32 KB/5 μs=6.4 GBps. For a four plane device, it may be 12.8 GBps. It should be noted this is one time entry penalty. If data access is spanning on multiple die latches, all of the dies can work in parallel (within substantially same latency). So for a four die NAND device (each with a four plane die), latch throughput speed would be: 4*64 KB/5 us=51.2 GBps. However, this speed may be limited by protocol and controller DMA throughput limitations. At least some controllers are designed to have DMA speeds to match protocol throughput (e.g. PCIe controller with four lanes have their speed capped at 8 GBps, USB2.0 controller has DMA throughput at 2 GBPs, etc.). The latch VM described herein is not an exact replacement of RAM but may be used as an auxiliary volatile storage media, e.g. where temporary processed data sets can be kept. A significant use of the methods herein is to avoid writing intermediate (non-final) computed data set to flash, which may result in poor endurance and low speeds.

Figure 11:
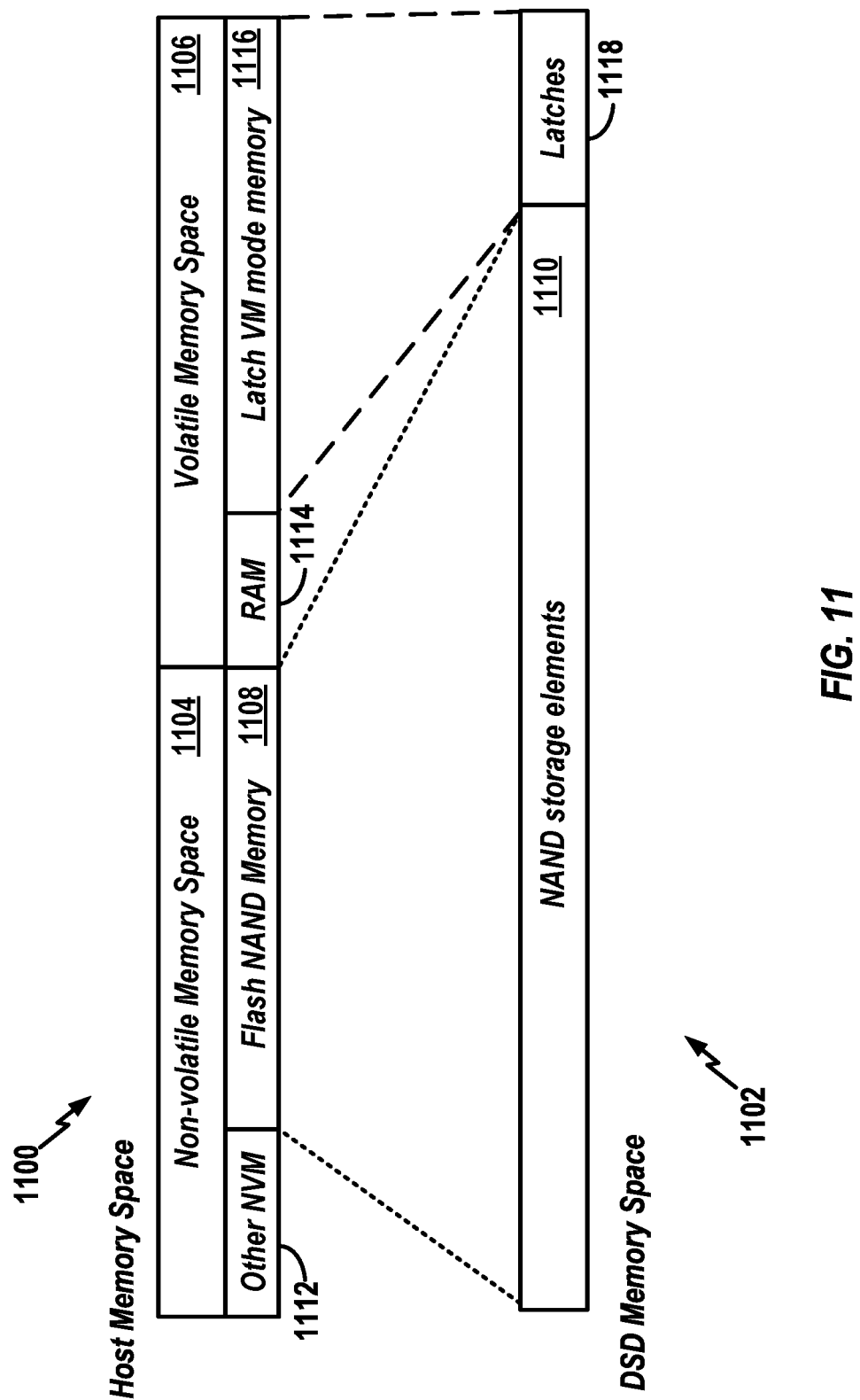
FIG. 11 illustrates exemplary memory spaces for a host and a DSD.

FIG. 11 illustrates portions of an exemplary host memory space 1100 and portions of an exemplary DSD memory space 1104. The host memory space 1100 includes an NVM memory space 1104 and a volatile memory space 1106. The host is aware that data in the volatile memory space will be stored within volatile memory components and hence the data will be lost when the memory device is powered off or if power is otherwise lost. The host is also aware that data in the NVM space will be stored within NVM components and hence will not be lost when the memory device is powered off or if power is otherwise lost. The host selects the particular portion of the memory space for storing data accordingly.

In the example of FIG. 11, the NVM space 1104 includes a flash NAND memory portion 1108 that is mapped via the DSD into a NAND storage elements portion 1110 of the DSD memory space 1102. Any data placed by the host into the flash NAND memory space 1108 is thus stored by the DSD in the NAND storage elements for subsequent retrieval. The NVM space 1104 may also include other NVM 1112, if available to the host. In the example of FIG. 11, the volatile memory space 1106 includes host RAM 1114 such as SRAM or DRAM, as well as latch VM mode memory 1116, which is mapped via the DSD into latches 1118 of the DSD memory space 1102. Any data placed by the host into the latch VM mode portion of the host memory space is thus stored by the DSD in the latches for subsequent retrieval. Notably, without the capability of storing volatile memory data in the latches 1118 of the DSD memory space 1102, the volatile memory space 1106 of the host might be quite small due to the relatively high costs associated with SRAM or DRAM. The provision of latch VM mode can thus greatly expand the volatile memory space of the host. Note that the sizes of the various portions of the memory spaces are not shown to scale.

Additional Exemplary Methods and Apparatus

Figure 12:
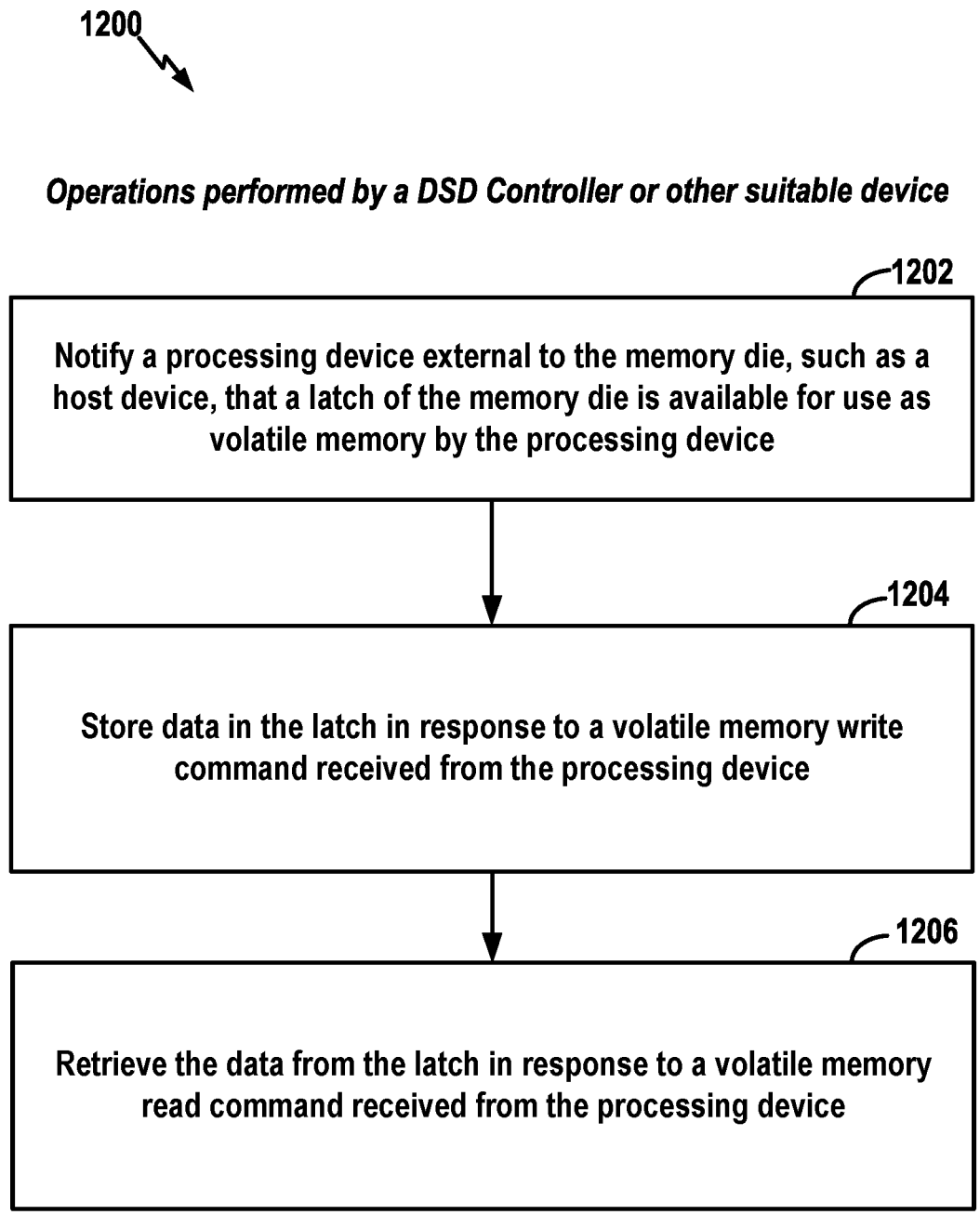
FIG. 12 is a flow chart that summarizes exemplary operations performed by a controller of a DSD or other suitable device.

FIG. 12 broadly illustrates a process 1200 in accordance with some aspects of the disclosure. The process 1200 may take place within any suitable apparatus or device capable of performing the operations that is coupled to an NVM die, such as a controller of a DSD that includes one or more NVM dies, at least one of which includes a latch. At block 1202, the controller notifies a processing device external to the memory die, such as a host device, that a latch of the memory die is available for use as volatile memory by the processing device. The processing device may be, for example, a host device or a component of a DSD such as a machine learning component. As explained above, in some examples, the notification may be part of a negotiation procedure with a host device. The latch may be one of a set of latches on a particular memory die, and the die may be one die within an NVM array of dies. At 1204, the controller stores data in the latch in response to a volatile memory write command received from the processing device. For example, the data may be received from a host device via RAM write commands. At 1206, the controller retrieves the data from the latch in response to a volatile memory read command received from the processing device. For example, the data may be retrieved from the latch for the host device in response to a RAM read command.

Figure 13:
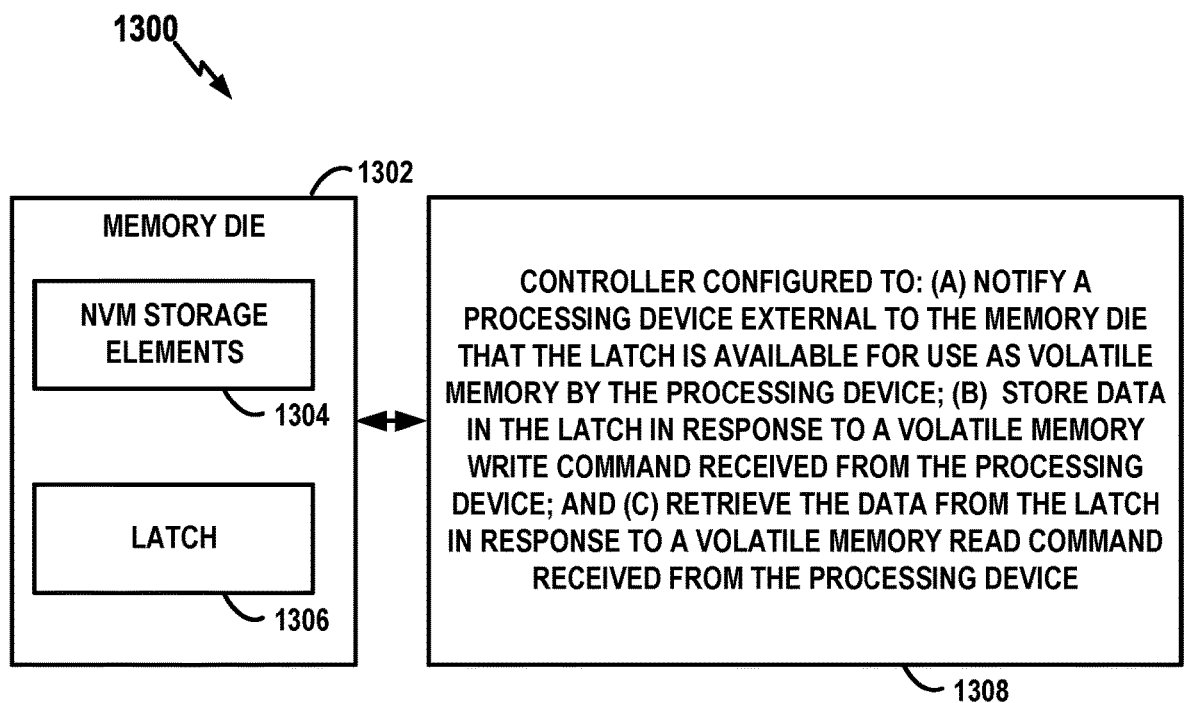
FIG. 13 is a schematic block diagram configuration for an exemplary DSD having a controller configured for use with latch-based VM storage.

FIG. 13 illustrates an embodiment of an apparatus 1300 configured according to one or more aspects of the disclosure. The apparatus 1300, or components thereof, could embody or be implemented within a data storage device. The apparatus 1300 includes a memory array 1302 that includes NVM storage elements 1304 and at least one latch 1306. The apparatus 1300 also includes a controller 1308 configured to: (a) notify a processing device external to the memory die, such as a host device or machine learning processor of a DSD, that the latch is available for use as volatile memory by the processing device; (b) store data in the latch in response to a volatile memory write command received from the processing device; and (c) retrieve the data from the latch in response to a volatile memory read command received from the processing device. As already explained, in some examples, the notification may be part of a negotiation procedure with a host device. The latch 1306 may be one of a set of latches on a particular memory die 1302, and the die 1302 may be one die within an NVM array of dies. The data may be received from a host device via RAM write commands, and the data may be retrieved from the latch for the host device in response to a RAM read command.

See, above, for illustrative examples.

Exemplary Apparatus for Use with NVM Array

Figure 14:
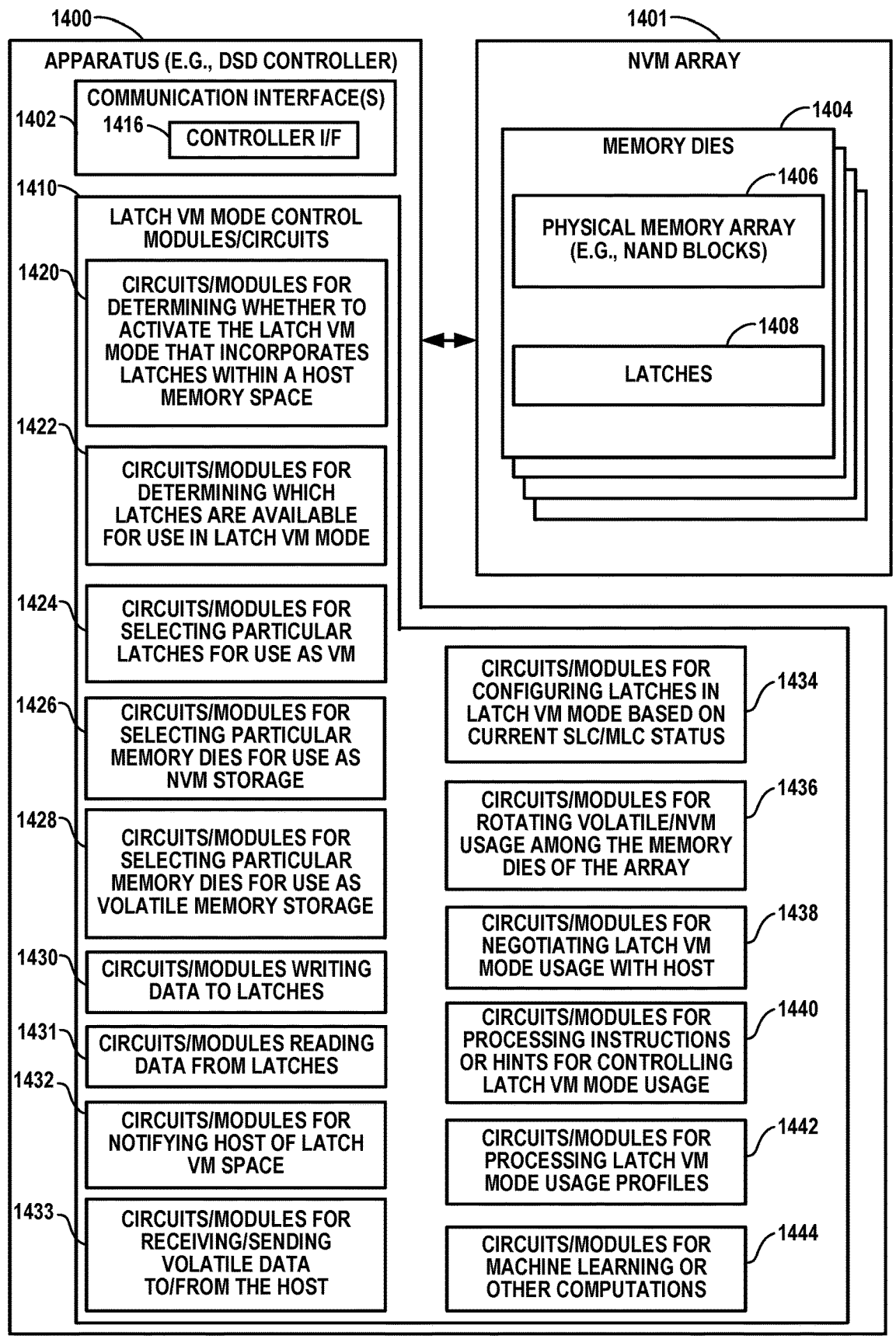
FIG. 14 is a schematic block diagram configuration for an exemplary apparatus such as a DSD configured for use with latch-based VM storage.

FIG. 14 illustrates an embodiment of an apparatus 1400 configured according to one or more aspects of the disclosure. The apparatus 1400, or components thereof, could embody or be implemented within a DSD other type of device that supports data storage. In various implementations, the apparatus 1400, or components thereof, could be a component of a processor, a controller, a computing device, a personal computer, a portable device, or workstation, a server, a personal digital assistant, a digital camera, a digital phone, an entertainment device, a medical device, a self-driving vehicle control device, or any other electronic device that stores, processes, or uses data.

The apparatus 1400 is communicatively coupled to an NVM array 1401 that includes one or more memory dies 1404, each of which may include physical memory arrays 1406, e.g. NAND blocks, and one or more latches 1408. The physical memory array 1406 and the latches 1408 may be communicatively coupled to the apparatus 1400 such that the apparatus 1400 can read or sense information from, and write or program information to, the physical memory array 1406 and the latches 1408. That is, the physical memory array 1406 and the latches 1408 can be coupled to circuits of apparatus 1400 so that the physical memory array 1406 and the latches 1408 are accessible by the circuits of apparatus 1400. Note that not all components of the memory dies are shown. The dies may include, e.g., extra-array processing circuits (e.g. under-the-array or next-to-the-array circuits), as well as input/output components, etc. The connection between the apparatus 1400 and the memory dies 1404 of the NVM array 1401 may include, for example, one or more busses.

The apparatus 1400 includes a communication interface 1402 and latch VM mode control modules/circuits 1410, which may be components of a controller or processor of the apparatus. These components can be coupled to and/or placed in electrical communication with one another and with the NVM array 1401 via suitable components, represented generally by connection lines in FIG. 14. Although not shown, other circuits such as timing sources, peripherals, voltage regulators, and power management circuits may be provided, which are well known in the art, and therefore, will not be described any further.

The communication interface 1402 provides a means for communicating with other apparatuses over a transmission medium. In some implementations, the communication interface 1402 includes circuitry and/or programming (e.g., a program) adapted to facilitate the communication of information bi-directionally with respect to one or more devices in a system. In some implementations, the communication interface 1402 may be configured for wire-based communication. For example, the communication interface 1402 could be a bus interface, a send/receive interface, or some other type of signal interface including circuitry for outputting and/or obtaining signals (e.g., outputting signal from and/or receiving signals into an SSD). The communication interface 1402 serves as one example of a means for receiving and/or a means for transmitting.

The modules/circuits 1410 are arranged or configured to obtain, process and/or send data, control data access and storage, issue or respond to commands, and control other desired operations. For example, the modules/circuits 1410 may be implemented as one or more processors, one or more controllers, and/or other structures configured to perform functions. According to one or more aspects of the disclosure, the modules/circuits 1410 may be adapted to perform any or all of the extra-array features, processes, functions, operations and/or routines described herein. For example, the modules/circuits 1410 may be configured to perform any of the steps, functions, and/or processes described with respect to FIGS. 1-13.

As used herein, the term "adapted" in relation to the processing modules/circuits 1410 may refer to the modules/circuits being one or more of configured, employed, implemented, and/or programmed to perform a particular process, function, operation and/or routine according to various features described herein. The modules/circuits may include a specialized processor, such as an application specific integrated circuit (ASIC) that serves as a means for (e.g., structure for) carrying out any one of the operations described in conjunction with FIGS. 1-13. The modules/circuits serve as an example of a means for processing. In various implementations, the modules/circuits may provide and/or incorporate, at least in part, functionality described above for the components in various embodiments shown, including for example component 116 of FIG. 1.

According to at least one example of the apparatus 1400, the processing modules/circuits 1410 may include one or more of: circuit/modules 1420 configured for determining whether to activate the above-described latch VM mode that incorporates latches 1408 within a host memory space; circuits/modules 1422 configured for determining which latches 1408 are available for use in latch VM mode; circuits/modules 1424 configured for selecting particular latches 1408 for use as VM; circuits/modules 1426 configured for selecting particular memory dies 1404 for use as NVM storage; circuits/modules 1428 configured for selecting particular memory dies 1404 for use as volatile memory storage; circuits/modules 1430 configured for writing data to the latches 1408 (in response, e.g., to RAM write command from the host); circuits/modules 1431 configured for reading data from the latches 1408 (in response, e.g., to RAM read command from the host); circuits/modules 1432 configured for notifying host of latch VM space; circuits/modules 1433 configured for receiving/sending volatile data to/from host; circuits/modules 1434 configured for configuring or enabling latches 1408 in latch VM mode based on current SLC/MLC status; circuits/modules 1436 configured for rotating volatile/NVM usage among the memory dies 1404 of the array 1401; circuits/modules 1438 configured for negotiating latch VM mode usage with the host; circuits/modules 1440 configured for processing instructions or hints for controlling latch VM mode usage; circuits/modules 1442 configured for processing latch VM mode usage profiles; and circuits/modules 1444 configured for machine learning or other computations.

In at least some examples, means may be provided for performing the functions illustrated in FIG. 14 and/or other functions illustrated or described herein. For example, the means may include one or more of: means, such as circuit/module 1420, for determining whether to activate the latch VM mode that incorporates latches within a host memory space; means, such as circuits/modules 1422, for determining which latches are available for use in latch VM mode; means, such as circuits/modules 1424, for selecting particular latches for use as VM; means, such as circuits/modules 1426, for selecting particular memory dies for use as NVM storage; means, such as circuits/modules 1428, for selecting particular memory dies for use as volatile memory storage; means, such as circuits/modules 1430, for writing data to a latch (in response, e.g., to RAM write command from the host); means, such as circuits/modules 1431, for read data from a latch (in response, e.g., to RAM read command from the host); means, such as circuits/modules 1432, for notifying host of latch VM space; means, such as circuits/modules 1433, for receiving/sending volatile data to/from host; means, such as circuits/modules 1434, for configuring or enabling latches in latch VM mode based on current SLC/MLC status; means, such as circuits/modules 1436, for rotating volatile/NVM usage among the memory dies of the array; means, such as circuits/modules 1438, for negotiating latch VM mode usage with the host; means, such as circuits/modules 1440, for processing instructions or hints for controlling latch VM mode usage; means, such as circuits/modules 1442, for processing latch VM mode usage profiles; and means, such as circuits/modules 1444, for or machine learning or other computations.

In yet another aspect of the disclosure, a non-transitory computer-readable medium is provided that has one or more instructions which when executed by a processing circuit in a DSD controller causes the controller to perform one or more of the functions or operations listed above.

Thus systems, devices and methods have been described that, among other features, provide for: storage media supporting dual mode operations wherein non-volatile and volatile operations (RAM/secondary cache) can be performed at the same time; host dynamic negotiation with a DSD between RAM size vs. non-volatile operation throughput; and control based on host need/hints using few NAND internal latches to store non-volatile host data. Among other possible advantages, the systems, devices and methods described herein may offer one or more of: (a) cost advantage for the Edge computing devices; (b) in an AI ecosystem, where data sets can be very large, multiple storage devices can contribute to form a large non-volatile memory region for use by the host; and (c) few if any hardware changes are required to existing devices. The systems, devices and methods can be implemented with host directives and device firmware changes (i.e. no significant additional costs to existing flash storage devices).

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NAND flash memory, such as 3D NAND flash memory. Semiconductor memory devices include volatile memory devices, such as DRAM or SRAM devices, NVM devices, such as ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage device, comprising:
   a memory die comprising non-volatile memory (NVM) storage elements and a latch comprising a volatile memory component of the memory die; and
   a controller coupled to the memory die and configured to:
     determine whether to make the latch of the memory die available for use as volatile memory by a host processing device;
     notify the host processing device, in response to a determination to make the latch available, that memory within the latch is available for use as volatile memory by the host processing device;
     receive a volatile memory write command from the host processing device that comprises data and an address corresponding to a storage location in the latch; and
     store the data at the storage location in the latch in response to the volatile memory write command received from the host processing device.

2. The data storage device of claim 1, wherein the controller is further configured to receive the volatile memory write command as a random access memory (RAM) write command.

3. The data storage device of claim 1, wherein the latch is one of a plurality of latches and wherein the controller is further configured to identify a particular latch that is available for use as volatile memory by identifying a latch that is not needed for NVM storage element read or write operations.

4. The data storage device of claim 3, wherein the controller is further configured to identify the particular latch based on whether the particular latch is needed for on-going single-level cell (SLC) NVM or multi-level cell (MLC) NVM storage element operations.

5. The data storage device of claim 4, wherein the controller is further configured to identify one or more MLC latches as being available for use as volatile memory when the memory die is performing on-going SLC NVM storage element operations using an SLC latch.

6. The data storage device of claim 1, wherein the memory die is one of a plurality of memory dies of an NVM array, and wherein the controller is further configured to identify particular memory dies of the NVM array that have one or more latches available for use as volatile memory by identifying particular dies not currently being used for NVM storage.

7. The data storage device of claim 1, wherein the controller is further configured to negotiate with the host processing device to determine a total amount of latch memory space to be made available to the host processing device as volatile memory.

8. The data storage device of claim 1, wherein the controller is further configured to determine whether to make the latch available for use as volatile memory based on hints received within metadata from the host processing device.

9. The data storage device of claim 1, wherein the controller is further configured to verify that the latch is available for use as volatile memory based on whether the latch is being used to process an NVM data storage command for accessing the NVM storage elements.

10. The data storage device of claim 1, wherein the latch is one of a plurality of latches, and wherein the controller is further configured to identify a particular latch of the plurality of latches that is available for use as volatile memory based, at least in part, on an address-to-latch mapping table.

11. The data storage apparatus of claim 1, wherein the controller is configured to determine whether to make the latch available for use as volatile memory by being further configured to determine to make the latch available for use as volatile memory only during a training phase of a machine learning computational procedure performed by the host processing device but not following completion of the training phase.

12. The data storage device of claim 11, wherein the controller is further configured to obtain an indication of the training phase of the computational procedure within a usage profile provided by the host processing device.

13. The data storage apparatus of claim 1, wherein the controller is further configured to store the data at the storage location in the latch by being further configured to perform a direct memory access (DMA) transfer from the host processing device to the NVM die.

14. The data storage apparatus of claim 13, wherein the controller is further configured to retrieve the data from the latch in response to a volatile memory read command by being further configured to perform a DMA transfer from the NVM die to the host device.

15. The data storage device of claim 1, further comprising a random access memory (RAM) coupled to the controller, wherein the RAM is separate from the NVM die, and wherein the controller is further configured to use at least a portion of the latch as supplemental RAM within a memory space of the controller that is separate from a memory space of the host processing device.

16. A method for use by a controller of a data storage device that includes a memory die with non-volatile memory (NVM) storage elements and a latch comprising a volatile memory component of the memory die, the method comprising:
    determining whether to make the latch of the memory die available for use as volatile memory by a host processing device;
    notifying the host processing device, in response to a determination to make the latch available, that memory within the latch is available for use as volatile memory by the host processing device;
    receiving a volatile memory write command from the host processing device that comprises data and an address corresponding to a storage location in the latch; and
    storing the data at the storage location in the latch in response to the volatile memory write command received from the host processing device.

17. The method of claim 16, wherein the method further comprises receiving the volatile memory write command as a random access memory (RAM) write command.

18. The method of claim 16, wherein the latch is one of a plurality of latches and wherein the method further comprises identifying a particular latch that is available for use as volatile memory by identifying a latch that is not needed for NVM storage element read or write operations.

19. The method of claim 18, further comprising identifying the particular latch based on whether the particular latch is needed for on-going single-level cell (SLC) NVM or multi-level cell (MLC) NVM storage element operations.

20. The method of claim 19, further comprising identifying one or more MLC latches as being available for use as volatile memory when the memory die is performing on-going SLC NVM storage element operations using an SLC latch.

21. The method of claim 16, wherein the memory die is one of a plurality of memory dies of an NVM array and wherein the method further comprises identifying particular memory dies of the NVM array that have one or more latches available for use as volatile memory by identifying particular dies not currently being used for NVM storage.

22. The method of claim 16, wherein the method further comprises negotiating a total amount of latch memory space to be made available to the host processing device as volatile memory.

23. The method of claim 16, wherein the method further comprises determining whether to make the latch available for use as volatile memory based on hints received within metadata from the host processing device.

24. The method of claim 16, further comprising verifying that the latch is available for use as volatile memory by verifying that the latch is not being used to process an NVM data storage command for accessing the NVM storage elements.

25. The method of claim 24, further comprising verifying that the latch is not being used to process the NVM data storage command by accessing one or more of a flash translation table (FTL) and a cache.

26. The method of claim 16, wherein the latch is one of a plurality of latches, and wherein a particular latch of the plurality of latches is identified as being available for use as volatile memory based, at least in part, on an address-to-latch mapping table.

27. The method of claim 16, wherein determining whether to make the latch available for use as volatile memory comprises determining to make the latch available for use as volatile memory only during a training phase of a machine learning computational procedure performed by the host processing device but not following completion of the training phase.

28. The method of claim 27, further comprising obtaining an indication of the training phase of the computational procedure within a usage profile provided by the host processing device.

29. The method of claim 16, wherein storing the data in the latch in response to the volatile memory write command comprises performing a direct memory access (DMA) transfer between the host processing device and the NVM die.

30. The method of claim 29, further comprising retrieving the data from the latch in response to a volatile memory read command by performing a DMA transfer from the NVM die to the host processing device.

31. The method of claim 16, wherein the data storage device further comprises a random access memory (RAM) coupled to the controller, wherein the RAM is separate from the NVM die, and wherein the method further comprises using at least a portion of the latch as supplemental RAM within a memory space of the controller that is separate from a memory space of the host processing device.

32. A data storage apparatus that includes a controller and a memory die having non-volatile memory (NVM) storage elements and a latch comprising a volatile memory component of the memory die, the apparatus comprising:
    means for determining whether to make the latch of the memory die available for use as volatile memory by a host processing device;
    means for notifying the host processing device, in response to a determination to make the latch available, that memory within the latch is available for use as volatile memory by the host processing device;
    means for receiving a volatile memory write command from the host processing device that comprises data and an address corresponding to a storage location in the latch; and
    means for storing the data at the storage location in the latch in response to the volatile memory write command received from the host processing device.

33. The data storage apparatus of claim 32, wherein the apparatus further comprises means for receiving the data for storage in the latch within a random access memory (RAM) write command from the host processing device.

34. The data storage apparatus of claim 32, wherein the latch is one of a plurality of latches, and wherein the apparatus further comprises means for identifying a particular latch of the plurality of latches as being available for use as volatile memory based, at least in part, on an address-to-latch mapping table.

\* \* \* \* \*